United States Patent
Lee et al.

(10) Patent No.: US 7,042,795 B2
(45) Date of Patent: May 9, 2006

(54) FLASH MEMORY DEVICE WITH BURST READ MODE OF OPERATION

(75) Inventors: Seung-Keun Lee, Gyeonggi-do (KR); Jin-Sung Park, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 41 days.

(21) Appl. No.: 10/816,979

(22) Filed: Apr. 2, 2004

(65) Prior Publication Data

US 2004/0228188 A1    Nov. 18, 2004

(30) Foreign Application Priority Data

Apr. 3, 2003    (KR) ............... 10-2003-0021120

(51) Int. Cl.
*G11C 8/00*    (2006.01)
(52) U.S. Cl. ............ 365/230.06; 365/185.06; 365/230.08; 365/230.09
(58) Field of Classification Search .......... 365/185.05, 365/185.06 X, 189.01, 189.09, 230.03, 230.06 O, 365/230.08 X, 230.09 X
See application file for complete search history.

(56) References Cited

U.S. PATENT DOCUMENTS

| | | | |
|---|---|---|---|
| 6,362,661 B1 | 3/2002 | Park | |
| 6,400,606 B1 | 6/2002 | Cho | |
| 6,507,534 B1* | 1/2003 | Balluchi | 365/230.06 |
| 6,958,949 B1* | 10/2005 | Confalonieri et al. | 365/230.06 |

* cited by examiner

*Primary Examiner*—VanThu Nguyen
(74) *Attorney, Agent, or Firm*—Marger Johnson & McCollom, P.C.

(57) ABSTRACT

A flash memory device is disclosed that includes a number of columns each of which is connected with a plurality of memory cells. A column selector circuit selects a part of the columns in response to a column address, and a plurality of sense amplifier groups are connected with the selected columns by the column selector circuit. The column selector circuit variably selects the columns according to whether the column address is 4N-aligned (where N is an integer having a value of 1 or more). For example, the column selector circuit chooses columns of the column address when the column address is 4N-aligned, and chooses columns of an upper column address when the column address is not 4N-aligned.

30 Claims, 17 Drawing Sheets

FLASH MEMORY DEVICE WITH BURST READ MODE OF OPERATION

This application claims priority from Korean Patent Application No. 2003-21120, filed on Apr. 3, 2003, the contents of which are herein incorporated by reference in their entirety.

FIELD OF THE INVENTION

This disclosure is directed toward a semiconductor memory device, and, in particular, to a flash memory device which supports a continuous burst read operation.

BACK GROUND OF THE INVENTION

One type of memory device which has found wide commercial success in the electronics industry is commonly referred to as flash memory. This commercial success is due in part to the ability of flash memory devices to store electronic data over long periods of time without an electric power supply. In addition, flash memory devices can be erased and programmed by the end user after they are installed in an electronic device. This combined functionality is especially useful in electronic device applications, such as cellular telephones, personal digital assistants, and computer BIOS storage, and other applications where power supply is intermittent and programmability is desired.

Flash memory devices are made up of an array of individual memory transistors, or cells, which are similar to those used in other types of memory devices. Flash memory devices, however, typically achieve non-volatility of the memory cells by the addition of a floating gate between the control gate and the substrate region of the transistors. Like other memory devices, the transistors are oriented in rows and columns to form an array of transistors. As is common in the memory device art, the control gates of the memory cells in each row of the array are connected to a series of word lines, thus forming individual rows of cells that can be accessed by selecting the corresponding word line. Similarly, the drain regions of the cells in each column of the array are connected to a series of bit lines, thus forming individual columns of cells that can be accessed by selecting the corresponding bit lines. Finally, the source regions of each of the cells in the array are connected to a common source line. In some flash memory devices, the array of transistors is subdivided into sectors of separate transistor arrays to provide added flexibility to the programming and erasing operations.

The data stored in each memory cell represents a binary 1 or 0, as is well-known in the art. To perform a program, read, or erase operation on a particular cell in the array, various predetermined voltages are applied to the control gate, drain region, and source region of the memory cell. By applying these predetermined voltages to a particular bit line column, a particular word line row, and the common source line, an individual cell at the intersection of the bit line and word line can be selected for reading or programming.

To program a cell, the control gate and the drain region of the cell are raised to predetermined programming voltages and the source is grounded. The voltages on the control gate and the drain region cause the generation of hot electrons which are injected onto the floating gate where they become trapped, forming a negative charge on the floating gate. This electron transfer mechanism is often referred to as Channel Hot Electron (CHE) injection. When the programming voltages are removed, the negative charge on the floating gate is maintained, thereby raising the threshold voltage. The threshold voltage is used during reading operations to determine if the cell is in a charged state, that is programmed, or whether the cell is in an uncharged state, that is un-programmed.

Cells are read by applying a predetermined voltage to the control gate and the drain region and grounding the source of the cell. The current in the bit line is then sensed with a sense amplifier. If the cell is programmed, the threshold voltage will be relatively high and the bit line current will be zero or at least relatively low, thus registering a binary 0. On the other hand, if the cell is erased, the threshold voltage will be relatively low and the bit line current will be relatively high, thus registering a binary 1.

In contrast to the programming procedure, flash memory devices are typically bulk-erased by simultaneously erasing all the cells in a memory sector. One procedure for erasing an entire memory sector involves applying predetermined voltages to the common source line and all the word lines of the sector while the drain regions of the cells are left floating. This causes electron tunneling from the floating gate to the source region through Fowler-Nordheim (F-N) tunneling, which removes the negative charge from the floating gate of each of the cells in the memory sector.

Typically, the read operations are performed as a random access function, in which the user specifies a particular address in the memory array for the memory device to read. However, one function that can be provided in the memory device is a burst read mode. A burst read mode is an embedded function that sequentially reads the data in the entire memory array and outputs the data thus read to the user during succeeding clock cycles. In this mode, the user does not need to provide the cell addresses because a state machine in the memory device sequentially generates each cell address in the memory array. Generally, this function is useful when the user desires an output of all of the data in the memory device.

A number of important performance factors must be considered when designing a burst read mode, however. For example, flash memory devices are often used in hand held devices that provide a limited capacity power supply. Thus, the power consumption during the read function should be minimized. In addition, the speed of the burst read mode should be relatively fast so that the user can receive the entire output of the memory device without having to wait for the device. Another problem is that some circuits in the memory device can only operate correctly when the applied voltages are within a restricted range. Thus, the voltage must be strictly regulated to ensure proper functioning of the device.

There is a need for sense amplifier groups which correspond to the number of data words to be output successively at a burst read operation. Referring to FIG. 11 which shows a conventional column gate structure required for a burst read operation, four sense amplifier groups 10, 11, 12 and 13 and four column gate circuits 20, 21, 22 and 23 are needed to issue four data words. The column gate circuits 20–23 select columns (or bit lines) in response to corresponding column select signals Yset00–Yset03, Yset10–Yset13, Yset20–Yset23 and Yset30–Yset33.

To increase the number of data words to be read at a burst mode of operation to improve a burst read operation speed, additional sense amplifier groups and column select circuits are needed—in proportion to an increased data word number. As column select circuits are increased, column select signal groups are necessary in proportion thereto. This means that signal lines for transferring column select signals are increased in proportion to an increased data word number. For example, when reading out four data words at a burst mode of operation, 16 column select signal lines are required because four column select signals are applied for each column select circuit. Similarly, 32 column select signal lines are necessary when eight data words are read out at the burst mode of operation. To increase the number of data words that can be read, the size of a column select structure such as that shown in FIG. 11 must be increased, which increases the chip size.

SUMMARY OF THE INVENTION

Embodiments of the invention provide a flash memory device that reduces the number of column select lines over conventional memory devices.

In accordance with one aspect of the present invention, a NOR-type flash memory device is provided which includes a plurality of bit lines each of which is connected with a plurality of non-volatile memory cells; a column gate circuit for selecting at least one of the bit lines in response to first selection signals and second selection signals; at least one sense amplifier connected to a bit line selected by the column gate circuit; a decoder circuit for generating the first selection signals in response to a first one of a column address; and circuitry for judging whether the column address is 4N-aligned, based on a second one of the column address, and generating the second selection signals. The column gate circuit includes a first switch circuit for selecting a first one of the bit lines in response to the first and second selection signals when the column address is 4N-aligned, and a second switch circuit for selecting a second one of the bit lines in response to the first and second selection signals when the column address is not 4N-aligned.

In some embodiments, the bit lines include first to fourth bit lines, the first selection signals include four column selection signals, and the second selection signals include two column selection signals.

In some embodiments, the first switch circuit includes first and second transistors connected in series between the first bit line and the sense amplifier; third and fourth transistors connected in series between the second bit line and the sense amplifier; fifth and sixth transistors connected in series between the third bit line and the sense amplifier; and seventh and eighth transistors connected in series between the fourth bit line and the sense amplifier. The first, third, fifth and seventh transistors are controlled by the first selection signals respectively; and the second, fourth, sixth and eighth transistors are controlled by one of the second selection signals.

In some embodiments, one of the second column selection signals is activated when the column address is 4N-aligned.

In some embodiments, the second switch circuit includes ninth and tenth transistors connected in series between the second bit line and the sense amplifier; eleventh and twelfth transistors connected in series between the third bit line and the sense amplifier; and thirteenth and fourteenth transistors connected in series between the fourth bit line and the sense amplifier. The ninth, eleventh and thirteenth transistors are controlled by first, second and third ones of the first selection signals respectively, and the tenth, twelfth and fourteenth transistors are controlled by the other of the second selection signals.

In some embodiments, the other of the second column selection signals is activated when the column address is not 4N-aligned.

In some embodiments, a bit line selected by the first switch circuit corresponds to the column address and a bit line selected by the second switch circuit corresponds to a upper one of the column address.

BRIEF DESCRIPTION OF THE DRAWINGS

A more complete appreciation of the present invention, and many of the attendant advantages thereof, will become readily apparent as the same becomes better understood by reference to the following detailed description when considered in conjuction with the accompanying drawings in which like reference symbols indicate the same or similar components, wherein.

DESCRIPTION OF THE PREFERRED EMBODIMENT

Preferred embodiments of the invention will be more fully described with reference to the attached drawings. The flash memory device described is a NOR-type flash memory device that performs a successive burst read operation. But, it is obvious to one skilled in the art that the present invention is not limited to NOR-type flash memory devices. The flash memory device will be described under the assumption that a burst length is 4.

Figure 1:
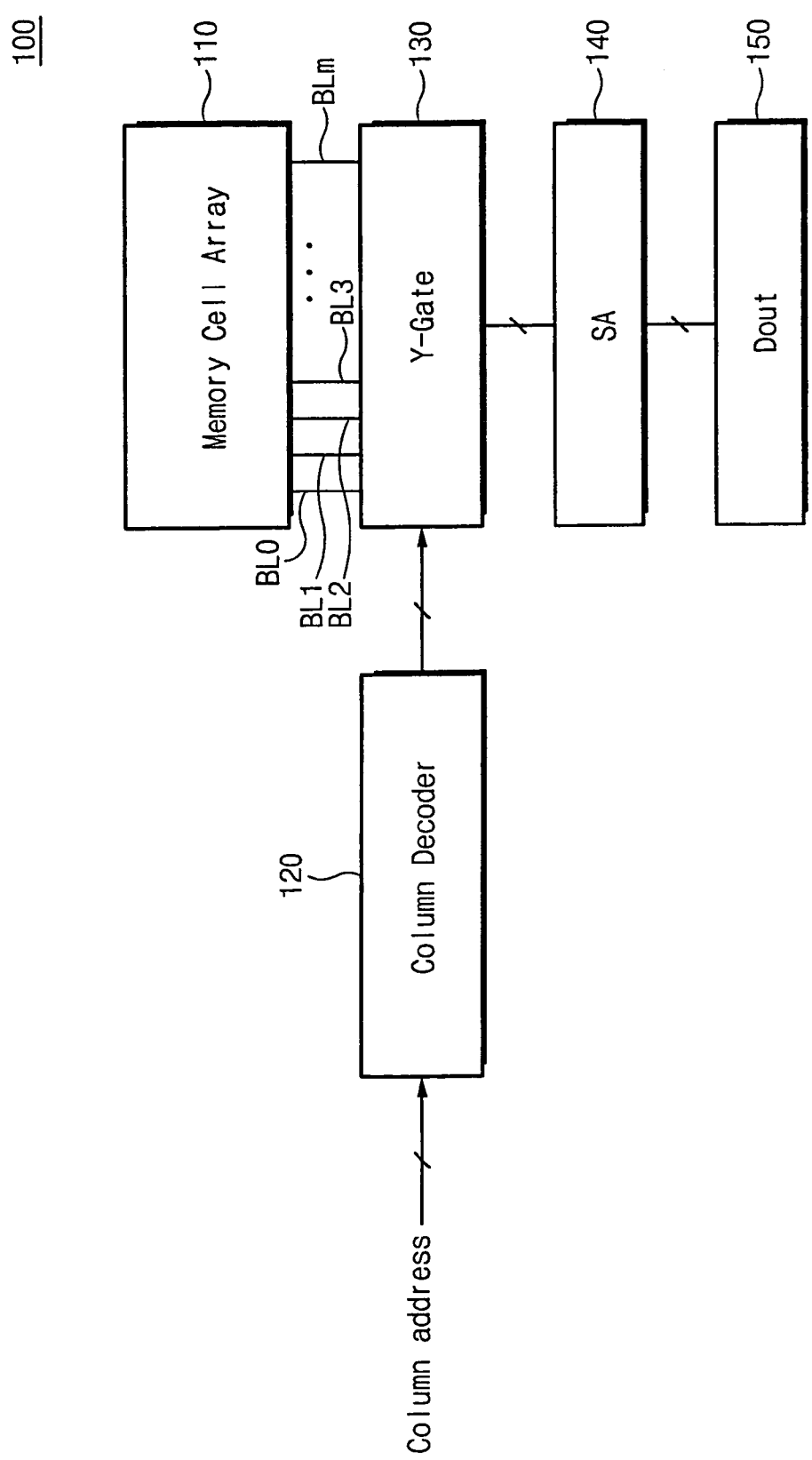
FIG. 1 is a block diagram of a flash memory device according to an embodiment of the present invention.

FIG. 1 is a block diagram of a flash memory device according to an embodiment of the present invention.

Referring to FIG. 1, a flash memory device 100 includes a memory cell array 110 for storing data information, which has a number of bit lines BLi (i=0–m). Although not shown in FIG. 1, a number of non-volatile memory cells are connected to each of the bit lines BLi. Each non-volatile memory cell includes a floating gate transistor. A column decoder circuit 120 receives a column address to generate select signals. A column gate circuit 130 (in this figure, marked by "Y-Gate") selects a part of the bit lines BL0–BLm in response to the select signals from the column decoder circuit 120, and connects the selected bit lines to a sense amplifier circuit 140 (in this figure, marked by "SA"). The sense amplifier circuit 140 senses and amplifies data from memory cells connected to the selected bit lines. The sensed amplified data is issued to the outside via a data output circuit 150 (in this figure, marked by "Dout").

In this embodiment, the column decoder circuit 120 and the column gate circuit 130 constitute a column selector circuit that selects a part of the bit lines in response to a column address.

A flash memory device of the present invention can carry out a continuous burst read operation where an initial address including a column address is supplied from the outside. Four data words are successively output according to only one input of a column address, which may be performed as follows. For example, in case that a burst length is 4, an initial address is received and then four-word data (e.g., D1, D2, D3 and D4) is read out from a memory cell array 110 during a predetermined time. The four data words thus read out are sequentially output to the outside in synchronization with a clock signal. To read four data words at once, sense amplifier groups each corresponding to data words may be used. For example, when one word is 16 and a burst length is 4, four sense amplifier groups (e.g., SAG0–SAG3) are required and each of the sense amplifier groups includes 16 sense amplifiers (e.g., SA0–SA15). Though one column address (e.g, N) is received, data words respectively output from the four sense amplifier groups are considered at the outside as if the output data words are assigned by different column addresses (e.g., Nth, (N+1)th, (N+2)th and (N+3)th column addresses).

Figure 2A:
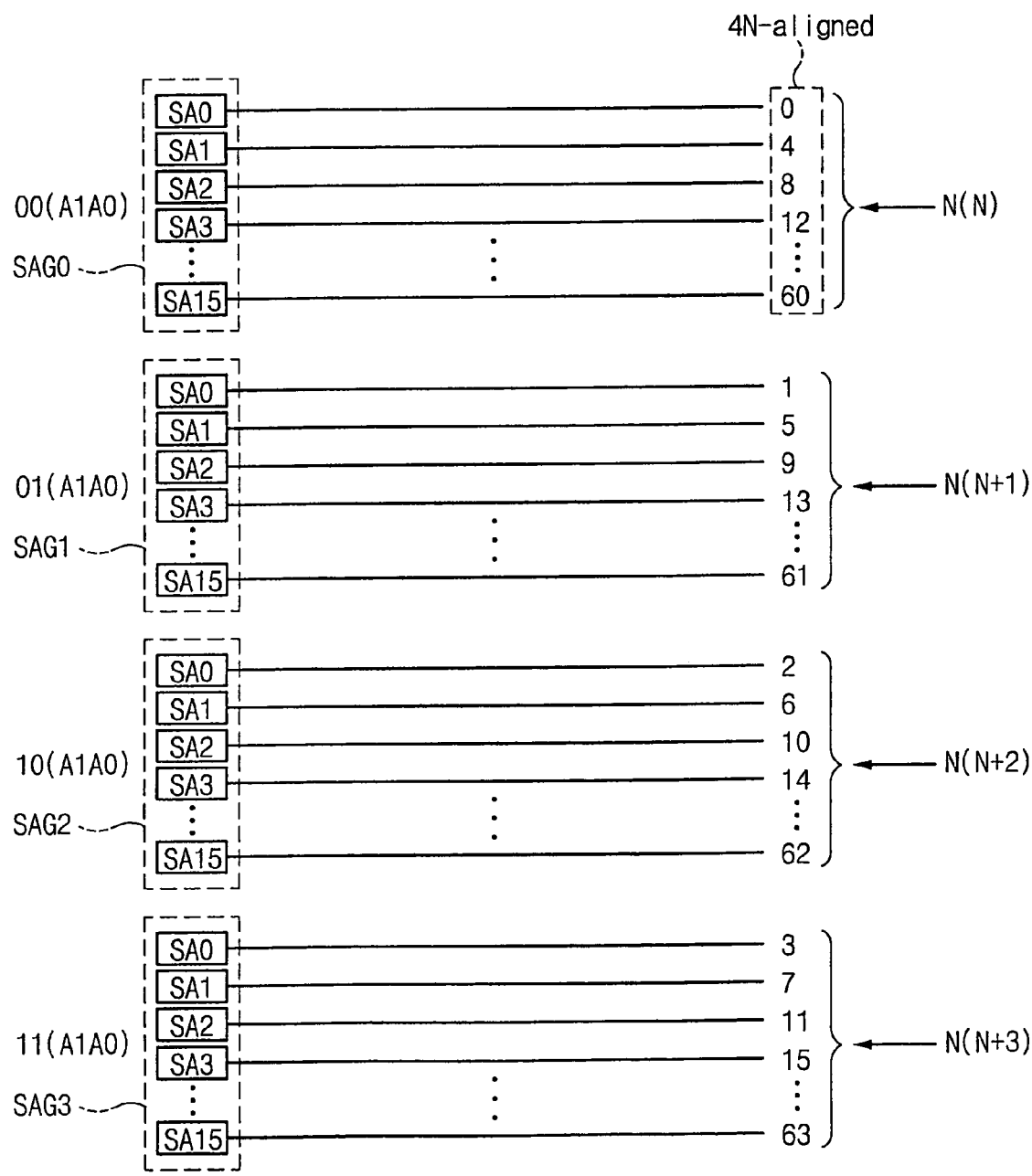
FIGS. 2A to 2D show data output ordering of sense amplifier blocks according to whether a column address is 4N-aligned.

Sense amplifier groups are selected by lower bits of a column address, and bit lines connected to the sense amplifier groups are selected by upper bits thereof. For example, as illustrated in FIG. 2A, when lower bit signals A1A0 are "00" (or in case that a column address is 4N-aligned), a data word of a first one SAG0 of sense amplifier groups SAG0–SAG3 is firstly output after a sense operation is carried out. Data words from the other sense amplifier groups SAG1–SAG3 (referred to as upper sense amplifier groups) are output in a sequence. In this case, data of the first sense amplifier group SAG0 corresponds to an Nth column address, data of the second sense amplifier group SAG1 corresponds to a (N+1)th column address, data of the third sense amplifier group SAG2 corresponds to a (N+2)th column address, and data of the fourth sense amplifier group SAG3 corresponds to a (N+3)th column address. In this case, four data words will be output normally.

Figure 2B:
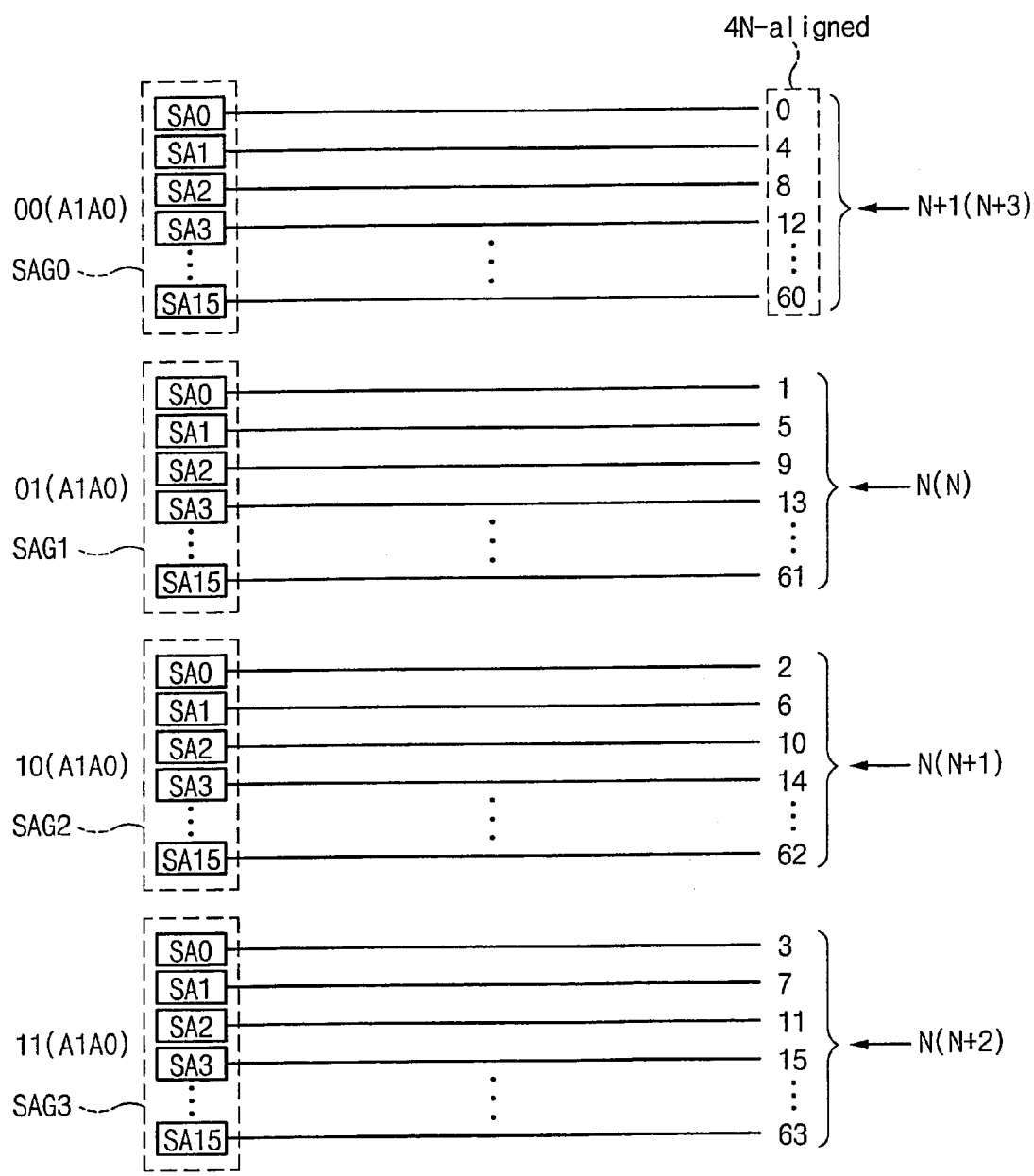

When lower bit signals A1A0 are "01" (or in case that a column address is not 4N-aligned), a data word of a second one SAG1 of the sense amplifier groups SAG0–SAG3 is firstly issued. Then, data words from third, fourth and first sense amplifier groups SAG2, SAG3 and SAG0 (SAG2 and SAG3 are referred to as upper sense amplifier groups and the SAG0 is referred to as a lower sense amplifier group) are output in a sequence. As illustrated in FIG. 2B, data of the second sense amplifier group SAG1 corresponds to an Nth column address, data of the third sense amplifier group SAG2 corresponds to a (N+1)th column address, and data of the fourth sense amplifier group SAG3 corresponds to a (N+2)th column address. However, data of the first sense amplifier group SAG0 corresponds not to a (N+3)th column address, but to a (N–1)th column address. Since bit lines of the first sense amplifier group SAG0 are selected by a column address for selecting bit lines of the other groups, data of the first sense amplifier group are considered at the outside as if data is read out by a (N–1)th column address.

Accordingly, in order that the first sense amplifier group reads out data of a (N+3)th column address, it is necessary to select bit lines of an upper address N–1 which is increased by 1 from an input column address N. In this case, since four data words are issued abnormally, selecting bit lines may be controlled differently from the above-described way. This will be described more fully below.

Figure 2C:
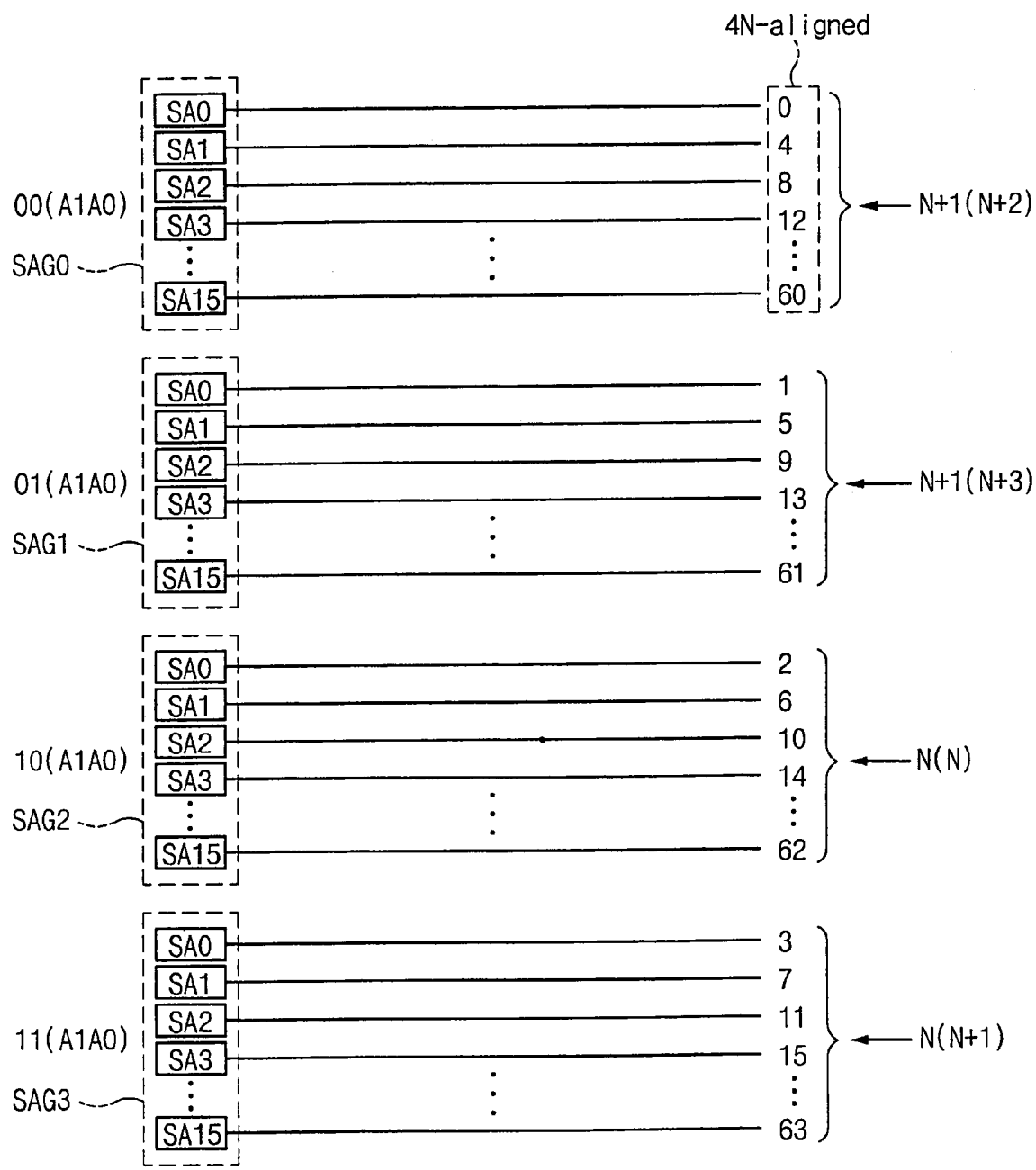

When lower bit signals A1A0 are "10" (or in case that a column address is not 4N-aligned), data of the third sense amplifier group SAG2 is firstly issued. And then, data words of the fourth, first and second sense amplifier groups SAG3, SAG0 and SAG1 (the SAG3 is referred to as upper sense amplifier groups and the SAG0 and SAG1 are referred to as lower sense amplifier groups) are output in a sequence. In this case, as illustrated in FIG. 2C, data of the third sense amplifier group SAG2 corresponds to an Nth column address and data of the fourth sense amplifier group SAG3 corresponds to a (N+1)th column address. But, because of the same reason as above-described, data words of the first and second sense amplifier groups correspond not to (N+2)th and (N+3)th column addresses, but to a (N–1)th column address. Accordingly, in order that the first and second sense amplifier groups read out data of (N+2)th and (N+3)th column addresses, it is necessary to select bit lines of an upper address N+1 which is increased by 1 from an input column address N. In this case, selecting bit lines may be controlled differently from the above-described way. This will be described more fully below.

Figure 2D:
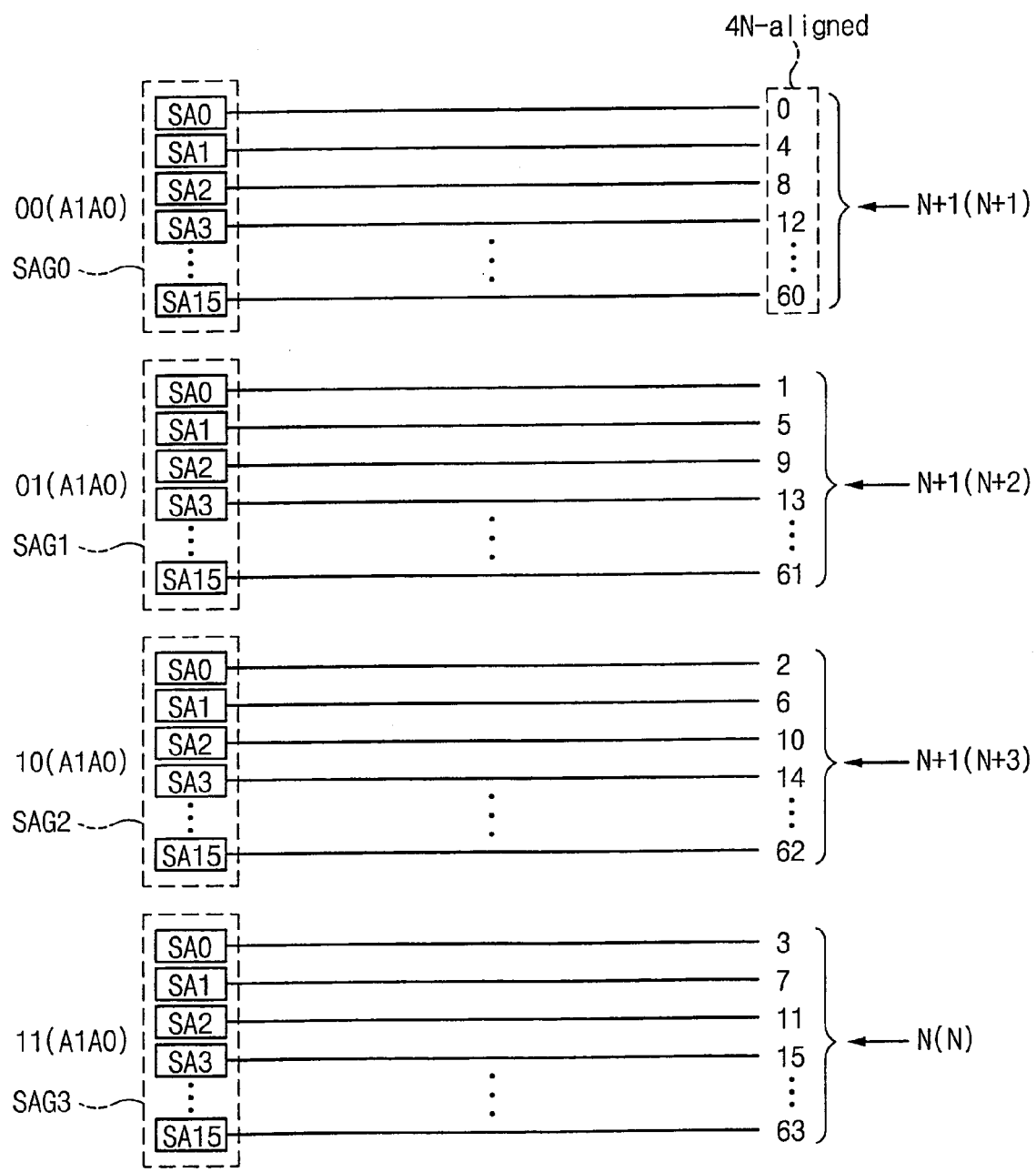

When lower bit signals A1A0 are "11", data of the fourth sense amplifier group SAG3 is firstly issued. And then data words of the first, second and third sense amplifier groups SAG0, SAG1 and SAG2 (the SAG0, SAG1 and SAG2 are referred to as lower sense amplifier groups) are issued in a sequence. In this case, as shown in FIG. 2D, data of the fourth sense amplifier group corresponds to an Nth column address. But, because of the same reason as above-described, data words of the first, second and third sense amplifier groups correspond not to (N+1)th, (N+2)th and (N+3)th column addresses, but to a (N–1)th column address. Accordingly, in order that the first, second and third sense amplifier groups read out data of (N+1)th, (N+2)th and (N+3)th column addresses, it is necessary to select bit lines of an upper address N+1 which is increased by 1 from an input column address N. In this case, selecting bit lines may be controlled differently from the above-described way. This will be described more fully below.

Figure 3:
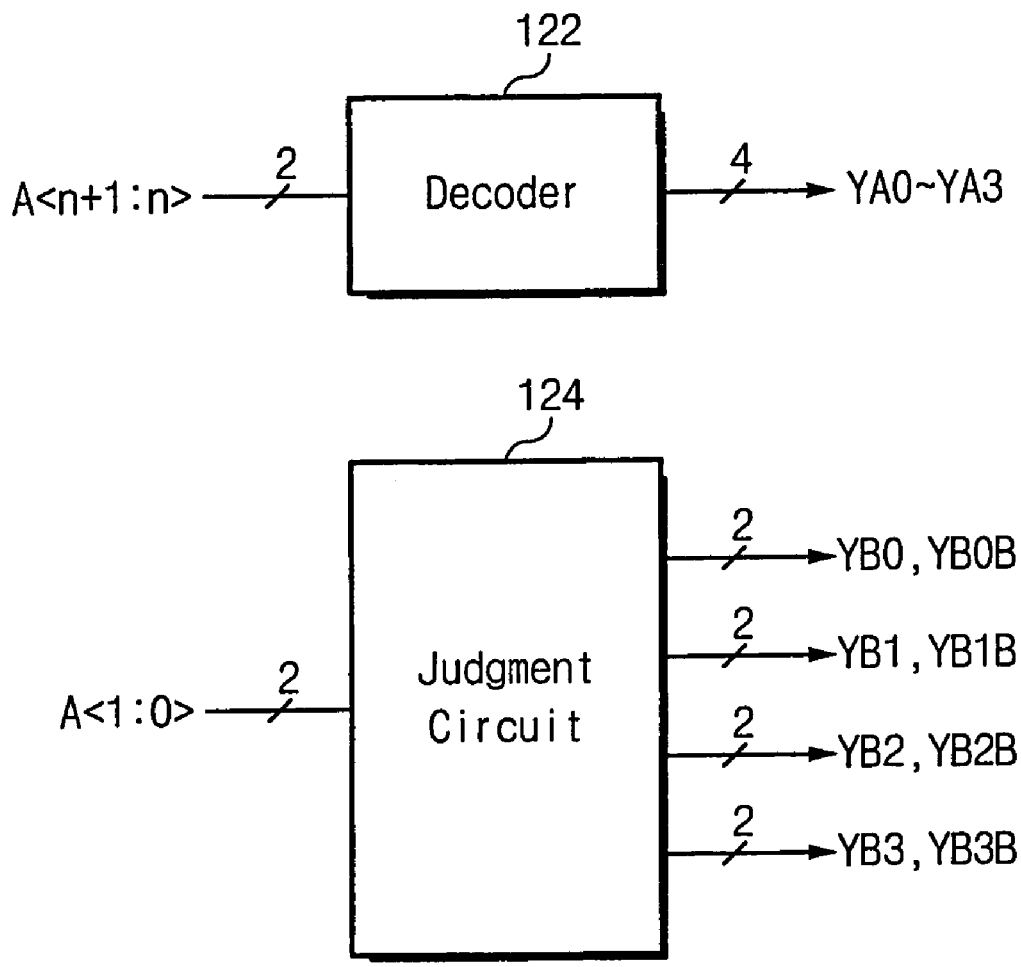
FIG. 3 is a block diagram of an example column decoder circuit of FIG. 1 according to embodiments of the invention.

FIG. 3 is a block diagram showing an example embodiment of a column decoder circuit 120 in FIG. 1.

Referring to FIG. 3, a column decoder circuit 120 includes a decoder 122 and a judgment circuit 124. The decoder 122 decodes column address signals An and An+1 to generate select signals YA0–YA3. The judgment circuit 124 receives column address signals A0 and A1 and judges whether a column address is 4N-aligned (N is an integer equal to 1 or more). The reason is because bit lines connected to sense amplifier groups are variably selected, as described in FIGS. 2A to 2D.

In this embodiment, the column address signals A0 and A1 are least significant bits of a column address.

If a column address is 4N-aligned (that is, when a data word of a first sense amplifier group SAG0 is first to be output), the judgment circuit 124 activates select signals YB0, YB1, YB2 and YB3 and deactivates select signals YB0B, YB1B, YB2B and YB3B. When a column address is not 4N-aligned and a data word of a second sense amplifier group SAG1 is firstly issued, the judgment circuit 124 activates select signals YB0B and YB1–YB3 and deactivates select signals YB0 and YB1B-YB3B. When a column address is not 4N-aligned and a data word of a third sense amplifier group SAG2 is firstly issued, the judgment circuit 124 activates select signals YB0B, YB1B, YB2 and YB3 and deactivates select signals YB0, YB1, YB2B and YB3B. When a column address is not 4N-aligned and a data word of a fourth sense amplifier group SAG3 is firstly issued, the judgment circuit 124 activates select signals YB0B, YB1B, YB2B and YB3 and deactivates select signals YB0, YB1, YB2 and YB3B.

Figure 4:
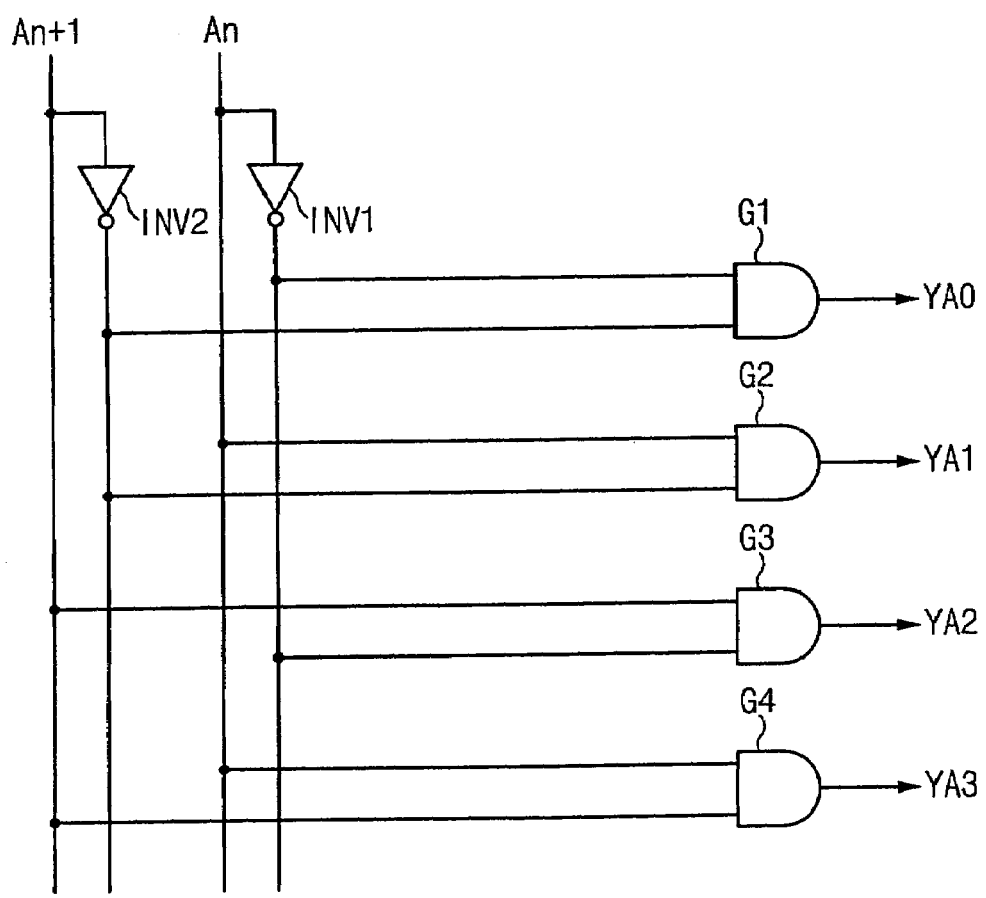
FIG. 4 is a circuit diagram of an example decoder circuit of FIG. 3 according to embodiments of the invention.

FIG. 4 is a circuit diagram showing an example embodiment of a decoder circuit in FIG. 3.

Referring to FIG. 4, a decoder circuit 122 decodes column address signals An and An+1 to activate one of select signals YA0, YA1, YA2 and YA3. The decoder circuit 122 includes inverters INV1 and INV2 and AND gates G1, G2, G3 and G4. The AND gate G1 outputs a select signal YA0 in response to outputs of the inverters INV1 and INV2. The AND gate G2 outputs a select signal YA1 in response to a column address signal An and an output of the inverter INV2. The AND gate G3 outputs a select signal YA2 in response to a column address signal An+1 and an output of the inverter INV1. The AND gate G4 outputs a select signal YA3 in response to the column address signals An and An+1. It is obvious to one skilled in the art that the decoder circuit 122 is not limited to this disclosed configuration.

Figure 5:
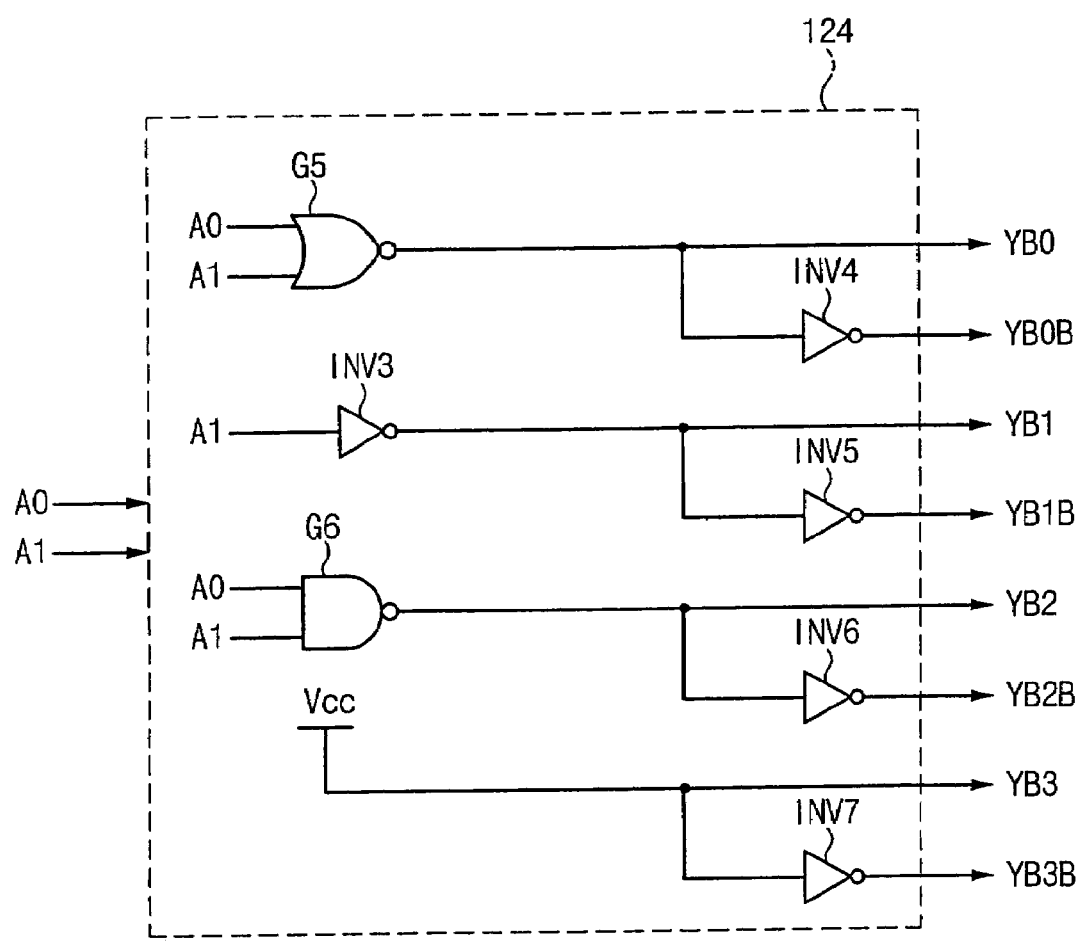
FIG. 5 is a circuit diagram of an example judgment circuit of FIG. 3 according to embodiments of the invention.

FIG. 5 is a circuit diagram showing an example embodiment of a judgment circuit in FIG. 3.

Referring to FIG. 5, a judgment circuit 124 outputs select signals YB0, YB0B, YB1, YB1B, YB2, YB2B, YB3 and YB3B in response to lower address signals A0 and A1. The judgment circuit 124 includes a NOR gate G5, a NAND gate G6, and inverters INV3, INV4, INV5, INV6 and INV7. The NOR gate G5 outputs a select signal YB0 in response to the negated column address signals A0 and A1, and the inverter INV4 inverts the select signal YB0 to output the select signal YB0B. The inverter INV3 inverts the column address signal A1 to output the select signal YB1, and the inverter INV5 inverts the select signal YB1 to output the inverted signal as the select signal YB1B. The NAND gate G6 outputs the select signal YB2 in response to the column address signals A0 and A1, and the inverter INV6 inverts the select signal YB2 to output the inverted signal as the select signal YB2B. Since the select signal YB3 is connected to a power supply voltage Vcc, the select signals YB3 and YB3B always have a logic high level and a logic low level, respectively.

As described above, the column address signals A0 and A1 are to select sense amplifier groups corresponding to a burst length. When the column address signals A1A0 are "00" a first sense amplifier group is selected as an output start point of a first data word. This makes select signals YB0–YB3 activated high. When the column address signals A1A0 are "10" a third sense amplifier group is selected as an output start point of a first data word. This makes select signals YB2, YB3, YB0B and YB1B activated high. When the column address signals A1A0 are "11" a fourth sense amplifier group is selected as an output start point of a first data word. This makes select signals YB3, YB0B, YB1B and YB2B activated high.

Activation of a select signal YB0, YB1, YB2 or YB3 means that bit lines of an input column address are selected. In this case, data words from the first sense amplifier group to the fourth sense amplifier group are issued sequentially. Data words issued in this order are considered at the outside as data words of Nth, (N+1)th, (N+2)th and (N+3)th column addresses. Activation of a select signal YB0B, YB1B or YB2B means that bit lines of an upper address of an input column address are selected. For example, when a select signal YB0B is activated, bit lines connected to a first sense amplifier group SAG0 correspond to an upper address of an input column address while bit lines connected to the other sense amplifier groups SAG1–SAG3 correspond to the input column address. When select signals YB0B and YB1B are activated, bit lines connected to first and second sense amplifier group SAG0 and SAG1 correspond to an upper address of an input column address while bit lines connected to the other sense amplifier groups SAG2 and SAG3 correspond to the input column address.

Figure 6A:
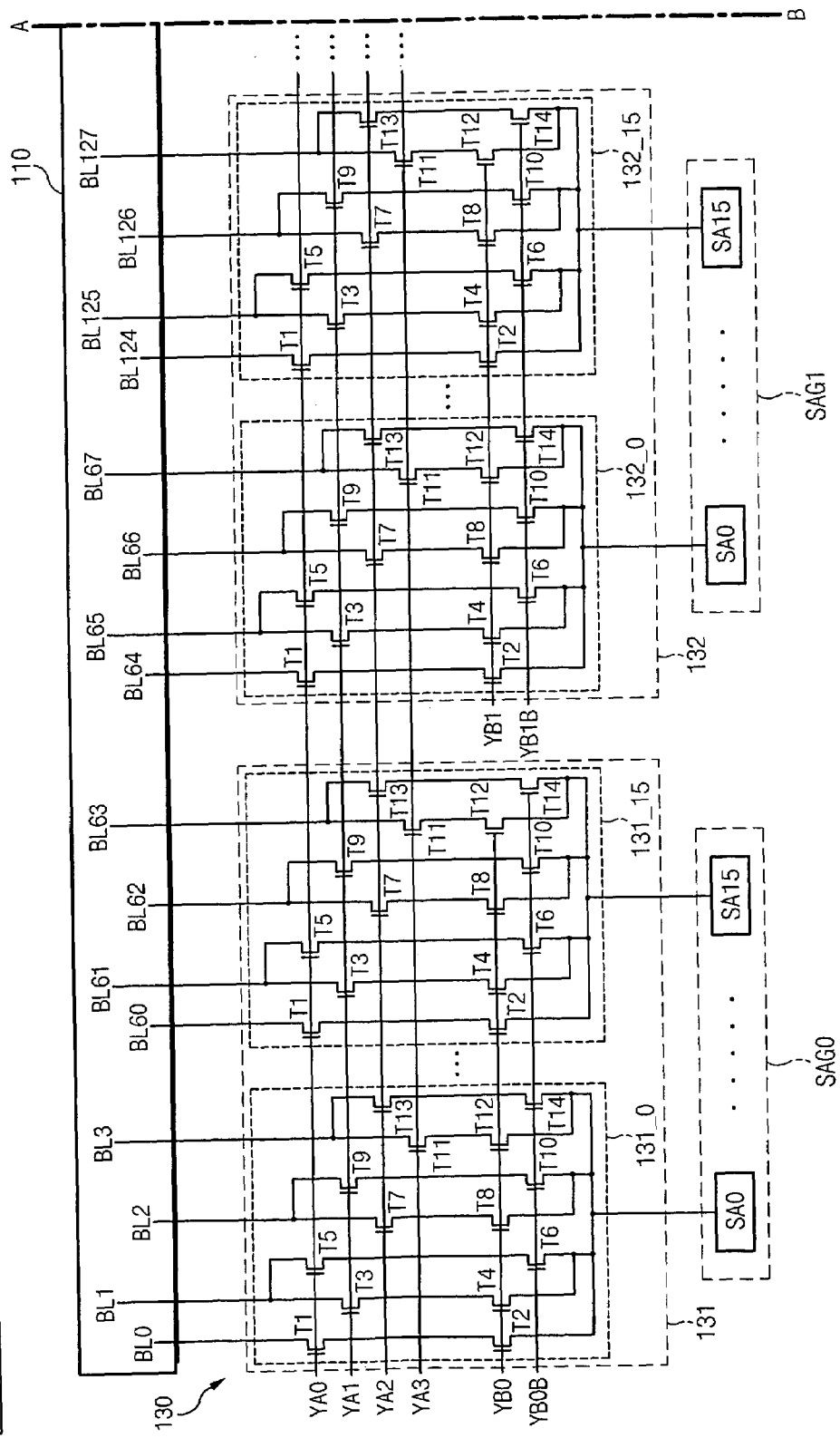
FIG. 6 is a circuit diagram of an example column gate circuit of FIG. 1 according to embodiments of the invention.
Figure 6B:
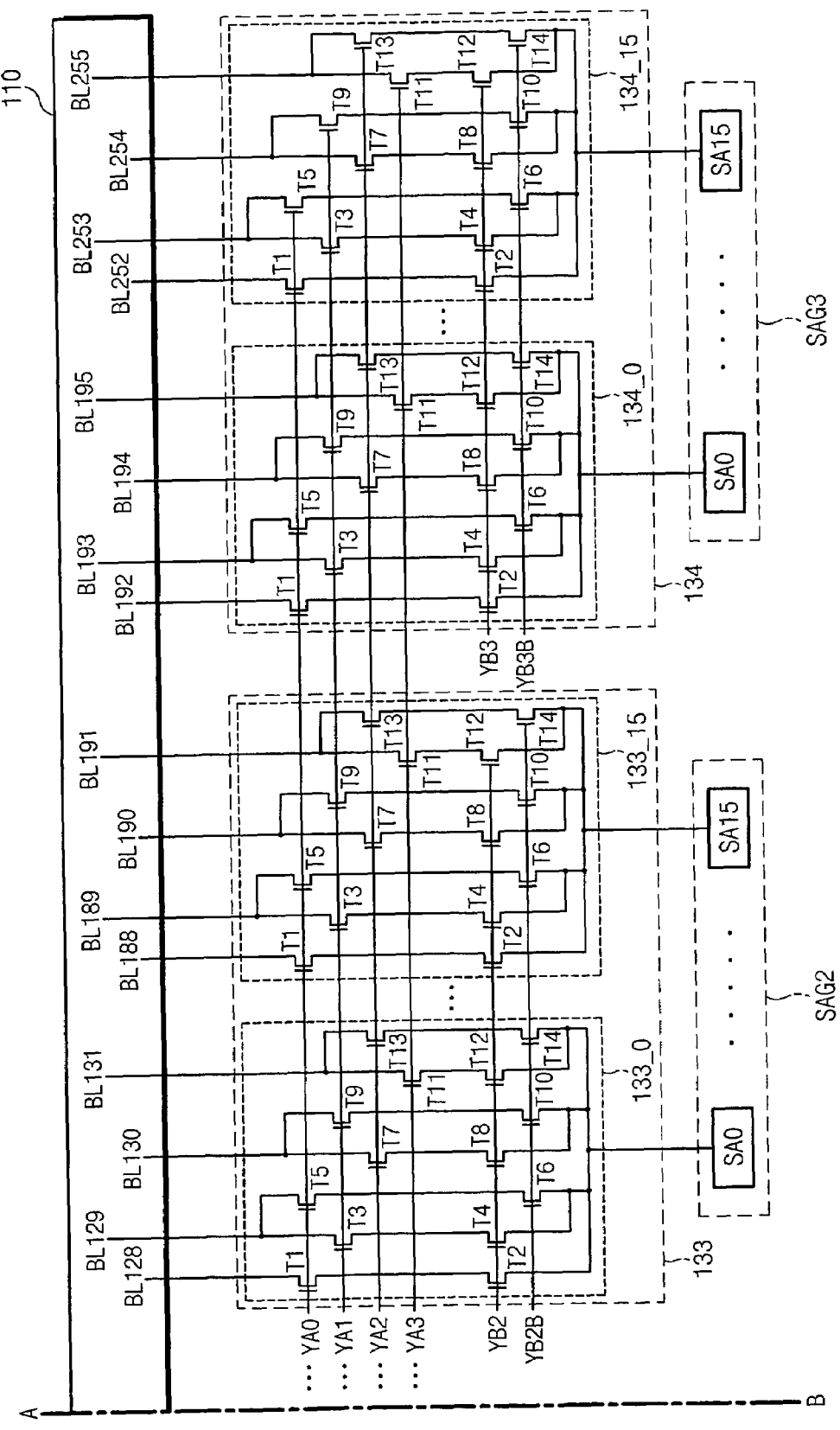

FIG. 6 is a circuit diagram showing an example column gate circuit according to embodiments of the invention of FIG. 1.

A column gate circuit 130 in FIG. 6 is designed under the assumption that a burst length is 4 and a bit organization is X16. But, it is obvious that the present invention is not limited to this disclosure. When a burst length is 4, four sense amplifier groups SAG0, SAG1, SAG2 and SAG3 are necessary and each of the sense amplifier groups SAG0–SAG3 is constituted of 16 sense amplifiers SA0–SA15. An exemplary sense amplifier is disclosed in U.S. Pat. Nos. 6,362,661 and 6,400,606 entitled "SENSE AMPLIFIER FOR USE IN A SEMICONDUCTOR MEMORY DEVICE" and "SENSE AMPLIFIER CIRCUIT FOR USE IN A NONVOLATILE SEMICONDUCTOR MEMORY DEVICE", which are herein incorporated by references.

Continuing to refer to FIG. 6, the column gate circuit 130 includes column gates 131, 132, 133 and 134 corresponding to sense amplifier groups SAG0–SAG3, respectively. Each of the column gates 131–134 includes a number of column gate units connected respectively to sense amplifiers of a corresponding sense amplifier group. For example, a column gate 131 includes 16 column gate units 131_0–131_15. Each of the column gates 131–134 selects 16 bit lines of 64 bit lines in response to select signals, and connects the selected bit lines to sense amplifiers of a corresponding sense amplifier group.

For example, the column gate 131 selects 16 bit lines of bit lines BL0–BL63 in response to select signals YA0–YA3, YB0 and YB0B, and connects the selected bit lines to corresponding sense amplifiers SA0–SA15 of a first sense amplifier group SAG0, respectively. The column gate 132 selects 16 bit lines of bit lines BL64–BL127 in response to select signals YA0–YA3, YB1 and YB1B, and connects the selected bit lines to corresponding sense amplifiers SA0–SA15 of a second sense amplifier group SAG1, respectively. The column gate 133 selects 16 bit lines of bit lines BL128–BL191 in response to select signals YA0–YA3, YB2 and YB2B, and connects the selected bit lines to corresponding sense amplifiers SA0–SA15 of a third sense amplifier group SAG2, respectively. The column gate 134 selects 16 bit lines of bit lines BL192–BL255 in response to select signals YA0–YA3, YB3 and YB3B, and connects the selected bit lines to corresponding sense amplifiers SA0–SA15 of a fourth sense amplifier group SAG3, respectively.

Still referring to FIG. 6, a first column gate unit 131_0 in the column gate 131 includes 14 NMOS transistors T1–T14. The NMOS transistors T1 and T2 are connected between a bit line BL0 and a sense amplifier SA0 and are controlled by select signals YA0 and YB0 respectively. The NMOS transistors T3 and T4 are cascaded between a bit line BL1 and the sense amplifier SA0 and are controlled by select signals YA1 and YB0, respectively. The NMOS transistors T5 and T6 are cascaded between the bit line BL1 and the sense amplifier SA0 and are controlled by select signals YA0 and YB0B, respectively. The NMOS transistors T7 and T8 are connected in series between a bit line BL2 and the sense amplifier SA1 and controlled by select signals YA2 and YB0, respectively. The NMOS transistors T9 and T10 are cascaded between the bit line BL2 and the sense amplifier SA0 and are controlled by select signals YA1 and YB0B, respectively. The NMOS transistors T11 and T12 are connected serially between a bit line BL3 and the sense amplifier SA0 and are controlled by select signals YA3 and YB0, respectively. The NMOS transistors T13 and T14 are cascaded between the bit line BL3 and the sense amplifier SA0 and are controlled by select signals YA2 and YB0B, respectively.

The other column gate units 131_2–131_15 are configured the same as the first column gate unit 131_0, and description thereof is thus omitted. Similarly, column gate units of each of the other column gates are configured the same as the column gate unit 131_0, and description thereof is thus omitted. In FIG. 6, constituent elements of each column gate unit are marked by the same symbols.

As understood from the figure, the select signals YA0–YA3 are commonly provided to NMOS transistors T1, T3, T5, T7, T9, T11 and T13 of column gate units of each of the column gates 131–134.

In this embodiment, the NMOS transistors T1, T2, T3, T4, T7, T8, T11 and T12 constitute a way (or a switch circuit) for selecting one of bit lines when a column address is 4N-aligned, the selected bit line corresponding to a presently input column address. The NMOS transistors T5, T6, T9, T10, T13 and T14 constitute a way (or a switch circuit) for selecting one of bit lines when a column address is not 4N-aligned, the selected bit line corresponding to an upper column address of a presently input column address. As illustrated in FIG. 6, two current paths (or referred to as a parallel current path) are provided between a bit line (e.g., BL1) and a sense amplifier (e.g., SA0). Each of the current paths consists of two NMOS transistors (e.g., (T3, T4) and (T5, T6)).

An operation of a flash memory device according to an embodiment of the present invention will be described more fully below with reference to accompanying drawings.

As row and column addresses for a burst read operation are input, firstly, a row selector circuit (not shown) selects a word line of a memory cell array 110 according to the row address. At the same time, a column decoder circuit 120 generates select signals for controlling a column gate circuit 130 in response to the column address.

As illustrated in FIG. 3, a decoder 122 decodes a part An and An+1 of a column address to activate one of select signals YA0–YA3. For example, assume that a select signal YA0 is activated. As the select signal YA0 is activated, NMOS transistors T1 and T5 of each column gate unit of a column gate circuit 130 are turned on. At the same time, a judgment circuit 124 responds to lower address signals A0 and A1 of the received column address and judges whether the received column address is 4N-aligned. As described above, that the column address is 4N-aligned means that a data word of a first sense amplifier group is firstly issued. The judgment circuit 124 outputs select signals YB0–YB3 and YB0B–YB3B according to a judgment result.

For example, when an input column address is 4N-aligned, the judgment circuit 124 activates the select signals YB0, YB1, YB2 and YB3 high. NMOS transistors T2, T4, T8 and T12 of each column gate unit are turned on by activation of the select signals YB0, YB1, YB2 and YB3. Accordingly, each column gate unit selects a first one of corresponding bit lines. That is, bit lines BL0, BL4, . . . , BL60 are connected to corresponding sense amplifiers SA0–SA15 through a column gate 131. The other column gates select bit lines by the same manner as described above. Selected bit lines correspond to a presently received column address.

Afterward, sense amplifiers SA0–SA15 of each of sense amplifier groups SAG0–SAG3 sense and amplify data by a well-known manner. If a sense amplification operation is completed, data words sensed by sense amplifier groups SAG0–SAG3 are output to the outside in this order. At this time, output data words are considered at the outside as data words of Nth, (N+1)th, (N+2)th and (N+3)th column addresses.

If the received column address is not 4N-aligned, the judgment circuit 124 activates a part of the select signals YB0, YB1, YB2 and YB3. At this time, complementary signals of deactivated select signals are activated. For example, when column address signals A1A0 are "01", select signals YB0B, YB1, YB2 and YB3 are activated. As the select signals YB0B, YB1, YB2 and YB3 are activated, NMOS transistors T6, T10 and T14 of each column gate unit of a first column gate 131 are turned on while NMOS transistors T2, T4, T8 and T12 of each column gate unit of the other column gates 132–134 are turned on. Accordingly, each column gate unit of second to fourth column gates 132–134 selects a first one of corresponding bit lines while each column gate unit of a first column gate 131 selects a second bit line. That is, the second column gate 132 connects bit lines BL64, BL68, . . . , BL124 to corresponding sense amplifiers SA0–SA15 respectively, the third column gate 133 connects bit lines BL128, BL132, . . . , BL188 to corresponding sense amplifiers SA0–SA15 respectively, and the fourth column gate 134 connects bit lines BL192, BL196, . . . , BL252 to corresponding sense amplifiers SA0–SA15 respectively. On the other hand, the first column gate 131 connects bit lines BL1, BL5, . . . , BL61 to sense amplifiers SA0–SA15, respectively.

Herein, the second to fourth column gates 132–134 select bit lines of a presently received column address (e.g., N) while the first column gate 131 selects bit lines of an upper address (e.g., N+1) of the presently received column address.

Afterward, sense amplifiers SA0–SA15 of each of sense amplifier groups SAG0–SAG3 sense and amplify data by a well-known manner. If a sense amplification operation is completed, data words sensed by sense amplifier groups SAG1, SAG2, SAG3 and SAG0 are output to the outside of the memory device in this order. At this time, output data words are considered at the outside as data words of Nth, (N+1)th, (N+2)th and (N+3)th column addresses.

When a column address is not 4N-aligned, for example, when column address signals A1A0 are "10" and "11", a column selecting operation will be performed by the same manner as described above. For instance, when column address signals A1A0 are "10", data words sensed by sense amplifier groups SAG2, SAG3, SAG0 and SAG1 are output to the outside in this order. Accordingly, the third and fourth column gates select bit lines of a presently input column address (e.g., N) while the first and second column gates select bit lines of an upper address (e.g., N+1) of the input column address. Output data words are considered at the outside as data words of Nth, (N+1)th, (N+2)th and (N+3)th column addresses. Similarly, when column address signals A1A0 are "11", data words sensed by sense amplifier groups SAG3, SAG0, SAG1 and SAG2 are output to the outside of the memory device in this order. Accordingly, the fourth column gate selects bit lines of a presently input column address (e.g., N) while the first, second and third column gates select bit lines of an upper address (e.g., N+1) of the input column address. Output data words are considered at the outside as data words of Nth, (N+1)th, (N+2)th and (N+3)th column addresses.

Figure 11:
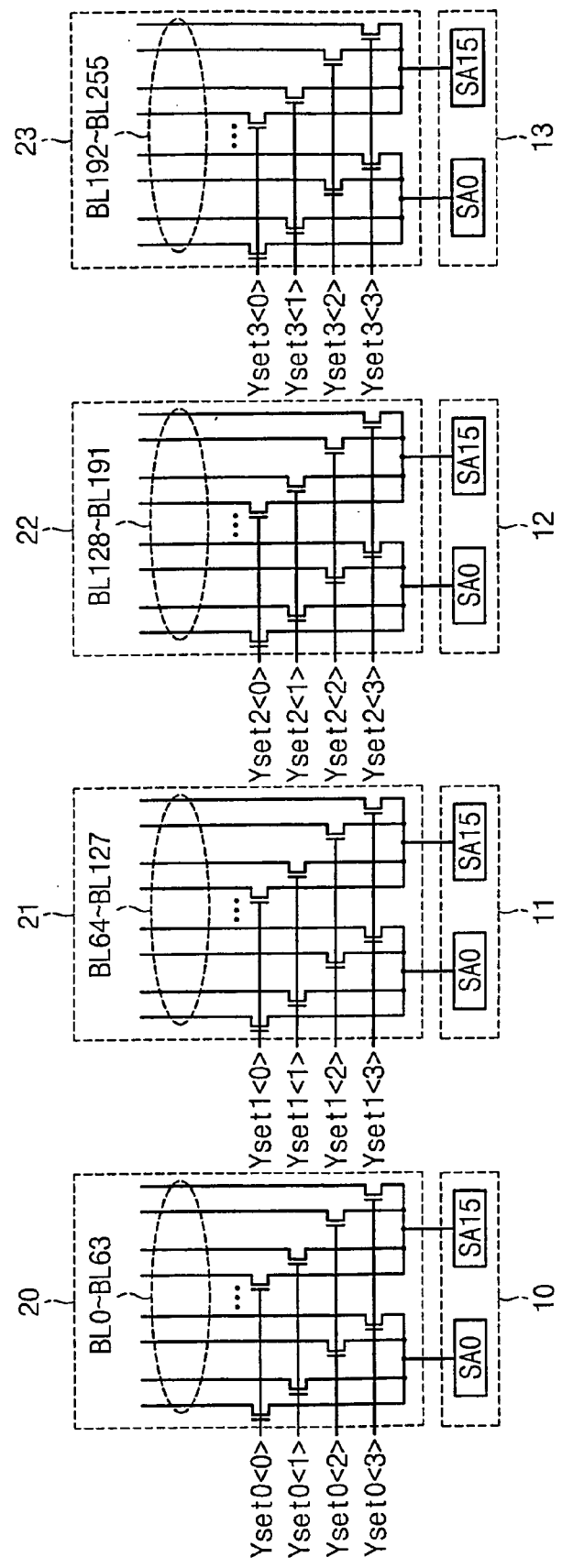
FIG. 11 is a circuit diagram of a conventional column gate circuit.

As described above, select signals YA0–YA3 commonly control NMOS transistors T1, T3, T5, T7, T9 and T11 of each of column gates 131–134, and NMOS transistors T2, T4, T6, T8, T10, T12 and T14 of each of column gates 131–134 are controlled by corresponding select signals YBi and YBiB (i=0–3). This means that four select signal lines YA0–YA3 and eight select signal lines YBi and YBiB (i=0–3) are necessary to transfer select signals to a column gate circuit 130. That is, twelve signal lines are used. Sixteen signal lines are necessitated for a column gate structure in FIG. 11 while twelve signal lines are necessitated for that according to embodiments of the present invention. That is, four fewer signal lines are used. Of course, more pass transistors (e.g., three times) are used based on a column gate structures of the present invention. But, it is capable of reducing the number of signal lines by roughly 50% when the number of data words to be read successively is increased.

Figure 7:
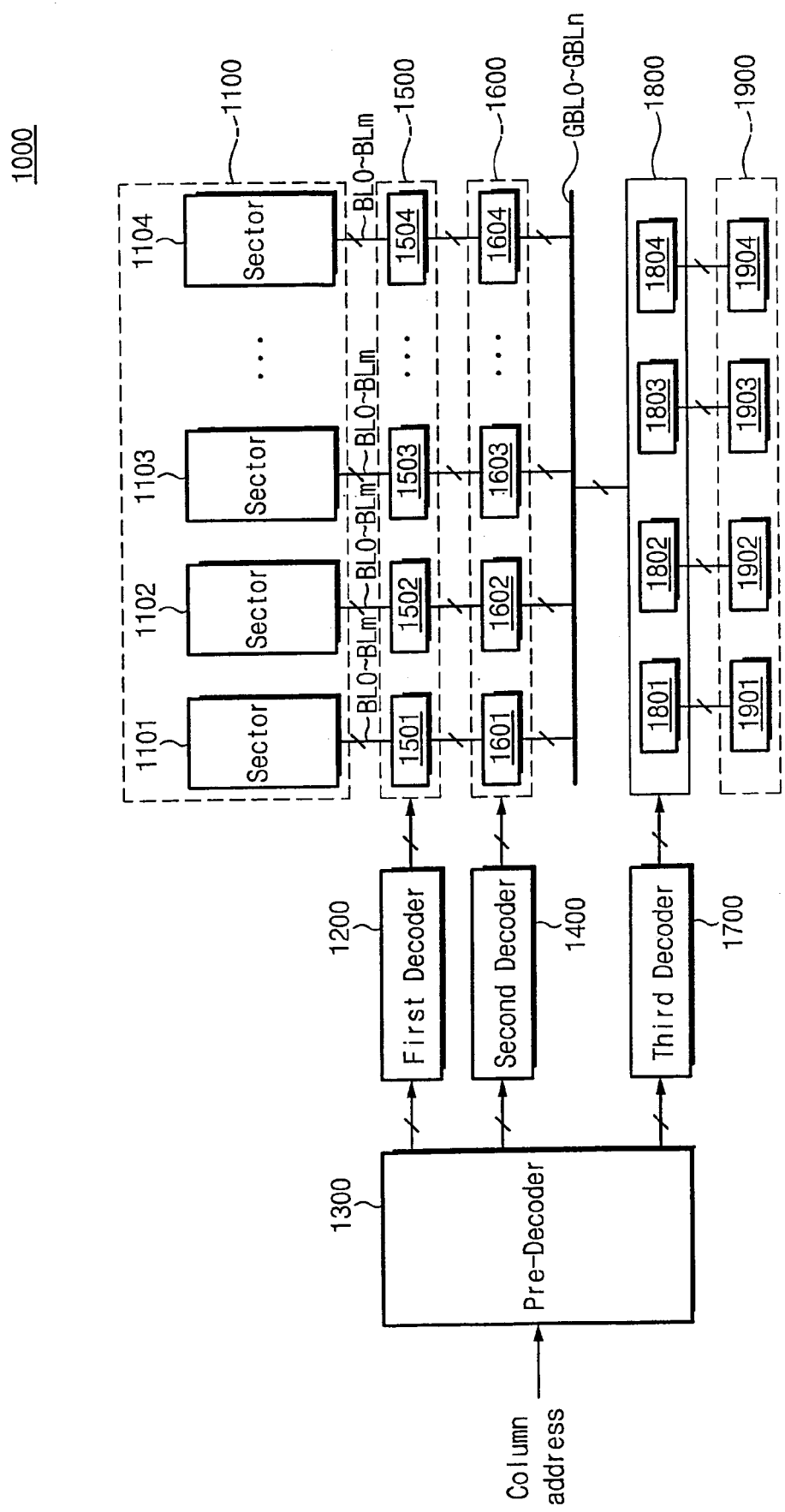
FIG. 7 is a block diagram of a flash memory device according to another embodiment of the present invention.

FIG. 7 is a block diagram of a flash memory device according to another embodiment of the invention.

Referring to FIG. 7, a flash memory device 1000 includes a memory cell array which consists of a number of sectors 1101–1104. Each of the sectors 1101–1104 includes a plurality of local bit lines. Although not illustrated in this figure, a plurality of non-volatile memory cells are connected to each local bit line. A first column decoder circuit 1200 generates select signals for selecting local bit lines in response to first column address signals from a column pre-decoder circuit 1300. A second column decoder circuit 1400 generates select signals for selecting sectors in response to second column address signals from the column pre-decoder circuit 1300.

Still referring to FIG. 7, a first column gate block 1500 includes column gate circuits 1501–1504 each corresponding to the sectors 1101–1104. The column gate circuits 1501–1504 operate responsive to select signals from the first column decoder circuit 1200. For example, the column gate circuit 1501 is connected to local bit lines BL0–BLm of a corresponding sector 1101 and selects a part of the local bit lines BL0–BLm in response to select signals from the first column decoder circuit 1200. The other column gate circuits 1502–1504 operate the same as the column gate circuit 1501. A sector selector block 1600 includes a number of sector selector circuits 1601–1604 each corresponding to the sectors 1101–1104 (or the column gate circuits). The sector selector circuits 1601–1604 operate responsive to select signals from the second column decoder circuit 1400. For example, the sector selector circuit 1601 connects local bit lines selected by a corresponding column gate circuit 1501 to global bit lines GBL0–GBLn, respectively. Only one of the sector selector circuits is activated such that selected local bit lines of one of the sectors 1101–1104 are connected to corresponding global bit lines, respectively.

A third column decoder circuit 1700 generates select signals in response to third column address signals from the column pre-decoder circuit 1300. A second column gate block 1800 selects a part of the global bit lines GBL0–GBLn in response to select signals from the third column decoder circuit 1700, and the selected global bit lines are connected to a sense amplifier block 1900 via the second column gate block 1800. The second column gate block 1800 includes column gate circuits whose number corresponds to a burst length. For example, when a burst length is 4, the second column gate block 1800 includes four column gate circuits 1801, 1802, 1803 and 1804. Similarly, the sense amplifier block 1900 consists of sense amplifier groups 1901, 1902, 1903 and 1904 so as to correspond to a burst length. Each sense amplifier group is constituted of sense amplifiers whose number corresponds to a bit organization.

Herein, the first column decoder circuit 1200, the second column decoder circuit 1400, the column gate block 1500 and the sector selector block 1600 constitute a column selector circuit which selects one of sectors and connects a part of local bit lines of the selected sector to global bit lines respectively. The third column decoder circuit 1700 and the column gate block 1800 constitute a column selector circuit which variably connects the global bit lines to sense amplifier blocks according to whether a column address is 4N-aligned.

Figure 8A:
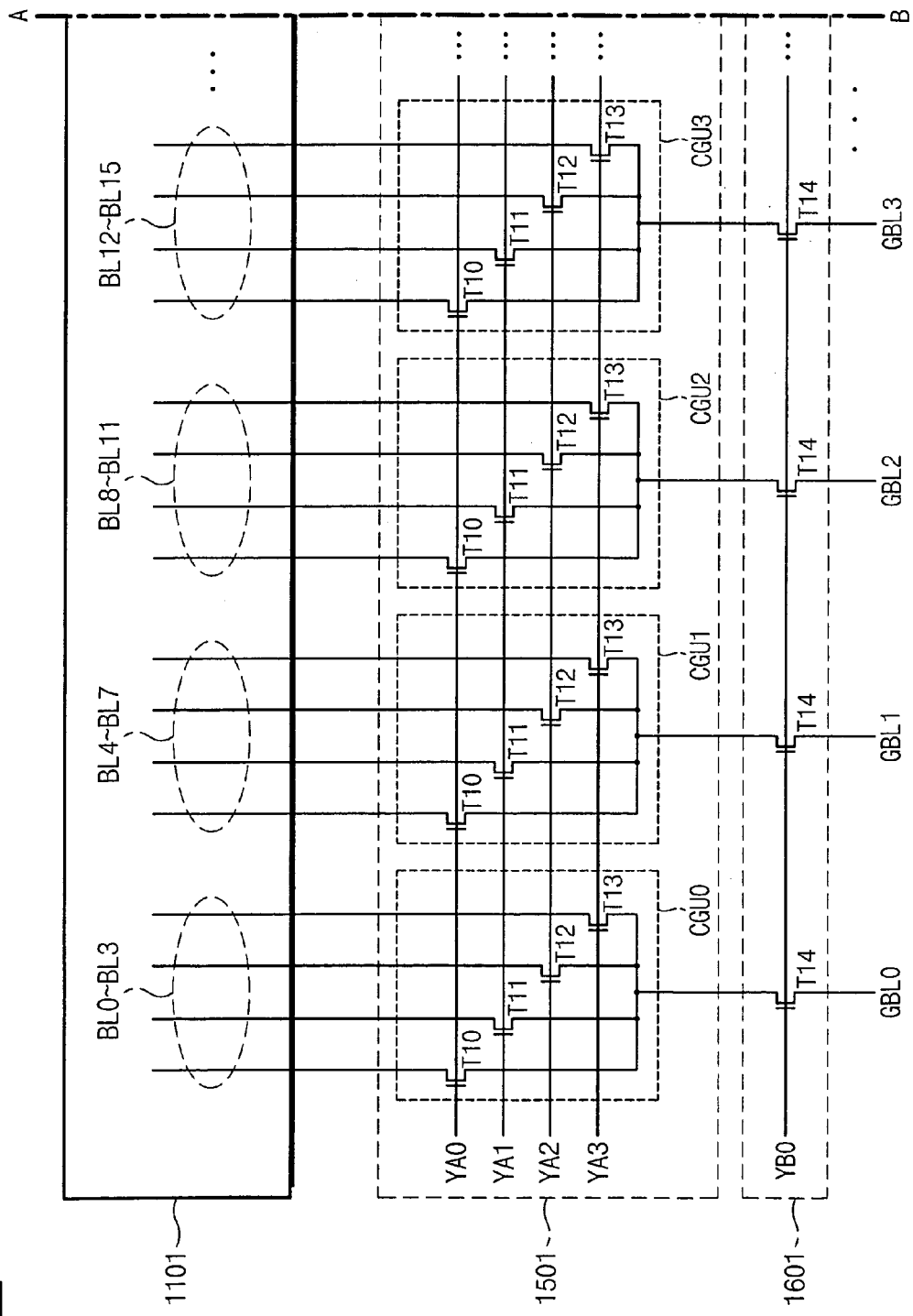
FIG. 8 is a circuit diagram of an example column gate circuit and a sector selector circuit of FIG. 7 related to one sector.
Figure 8B:
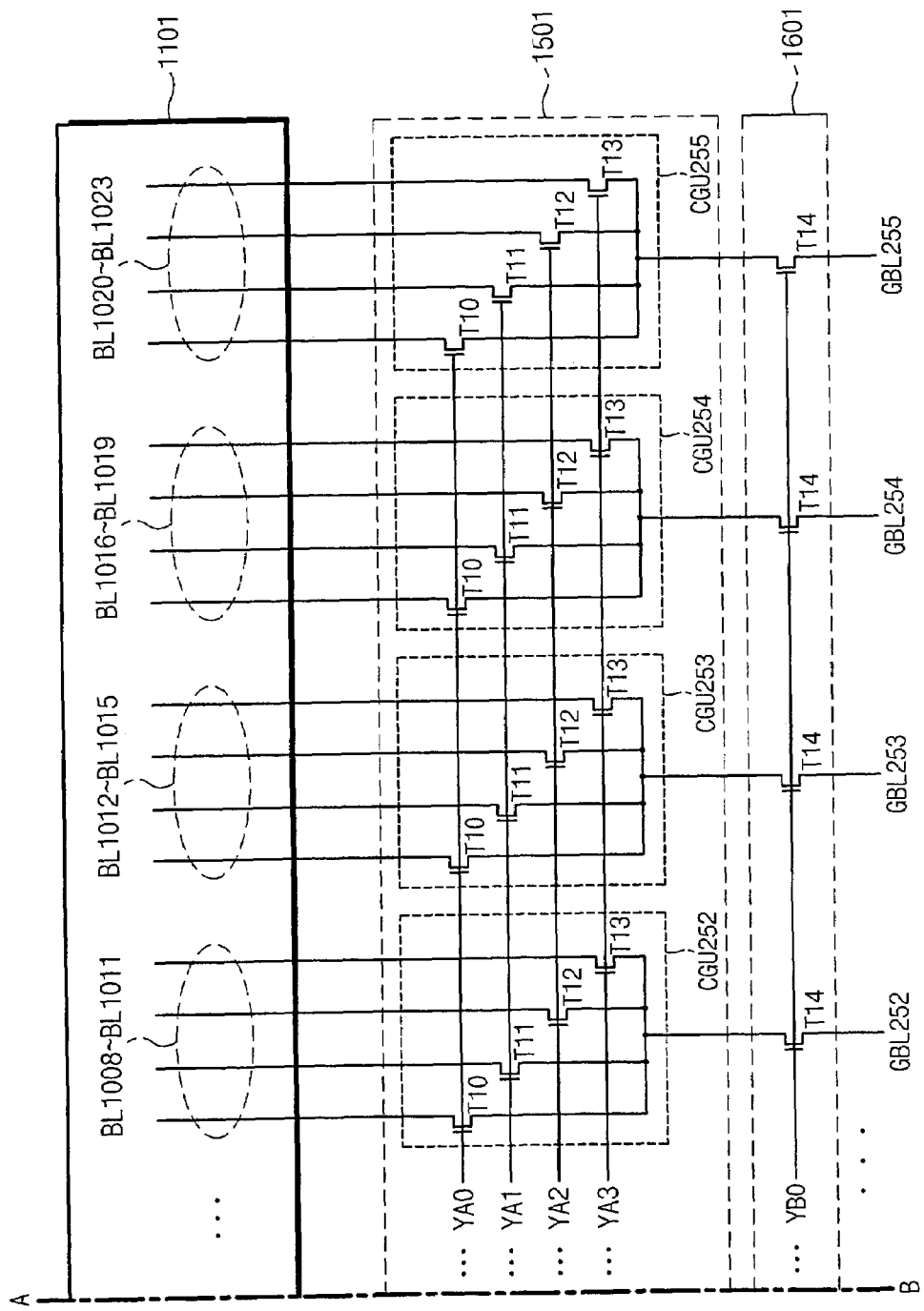

FIG. 8 is a circuit diagram of a column gate circuit and a sector selector circuit in FIG. 7 related to one sector. Assume that one sector 1101 includes 1024 local bit lines BL0–BL1023.

A column gate circuit 1501 selects a part of local bit lines BL0–BL1023 in response to select signals YA0–YA3 from the first column decoder circuit 1200. The column gate circuit 1501 includes a number of column gate units CGU0–CGU255 each corresponding to global bit lines GBL0–GBL255. Each column gate unit includes four NMOS transistors T10, T11, T12 and T13 which are connected as illustrated in FIG. 8. Each column gate unit selects one of four local bit lines in response to the select signals YA0–YA3. For instance, the column gate unit CGU0 selects one of local bit lines BL0–BL3 in response to the select signals YA0–YA3.

A sector selector circuit 1601 includes a number of NMOS transistors T14 each corresponding to global bit lines GBL0–GBL255 (or column gate units), and the NMOS transistors T14 are controlled commonly by a select signal YB0. Accordingly, local bit lines selected by the column gate circuit 1501 are connected to the global bit lines GBL0–GBL255 via the sector selector circuit 1601, respectively.

A column gate circuit and a sector selector circuit corresponding to each of the other sectors 1102–1104 are configured the same as illustrated in FIG. 8, and description thereof is thus omitted. The sector selector circuits are configured to be activated respectively by corresponding select signals so that only one sector is selected. In this embodiment, column gate circuits are controlled commonly by select signals YA0–YA3, but it is obvious to one skilled in the art that column gate circuits can be controlled in ways different than described herein.

Figure 9:
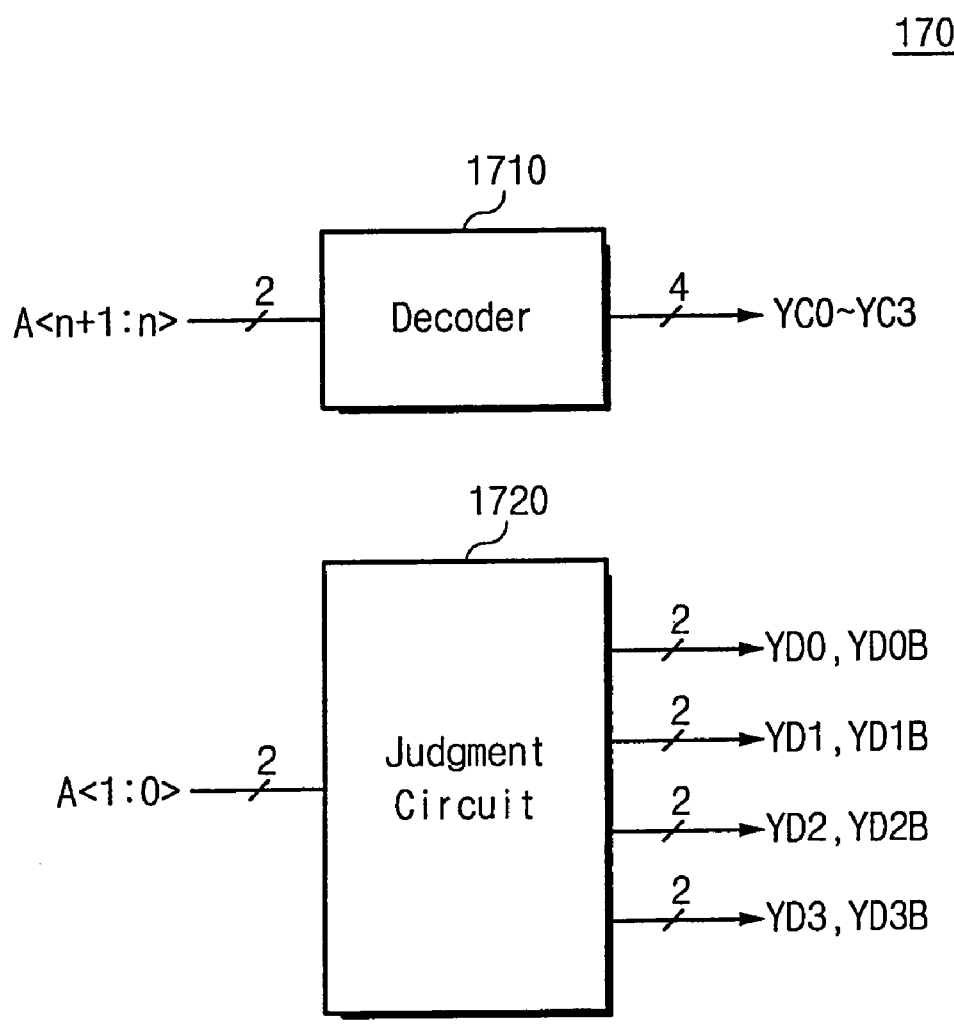
FIG. 9 is a block diagram of an example third column decoder circuit of FIG. 7 according to embodiments of the invention.

FIG. 9 shows an example embodiment of a third column decoder circuit 1700 of FIG. 7.

Referring to FIG. 9, a column decoder circuit 1700 according to the present invention includes a decoder 1710 and a judgment circuit 1720. The decoder 1710 decodes column address signals An and An+1 from a column pre-decoder circuit 1300 to generate select signals YC0–YC3. The judgment circuit 1720 receives column address signals A0 and A1 from the column pre-decoder circuit 1300 and judges whether a column address is 4N-aligned (N is 1 or more integer). Herein, the column address signals A0 and A1 are least significant bits of a column address.

Figure 10A:
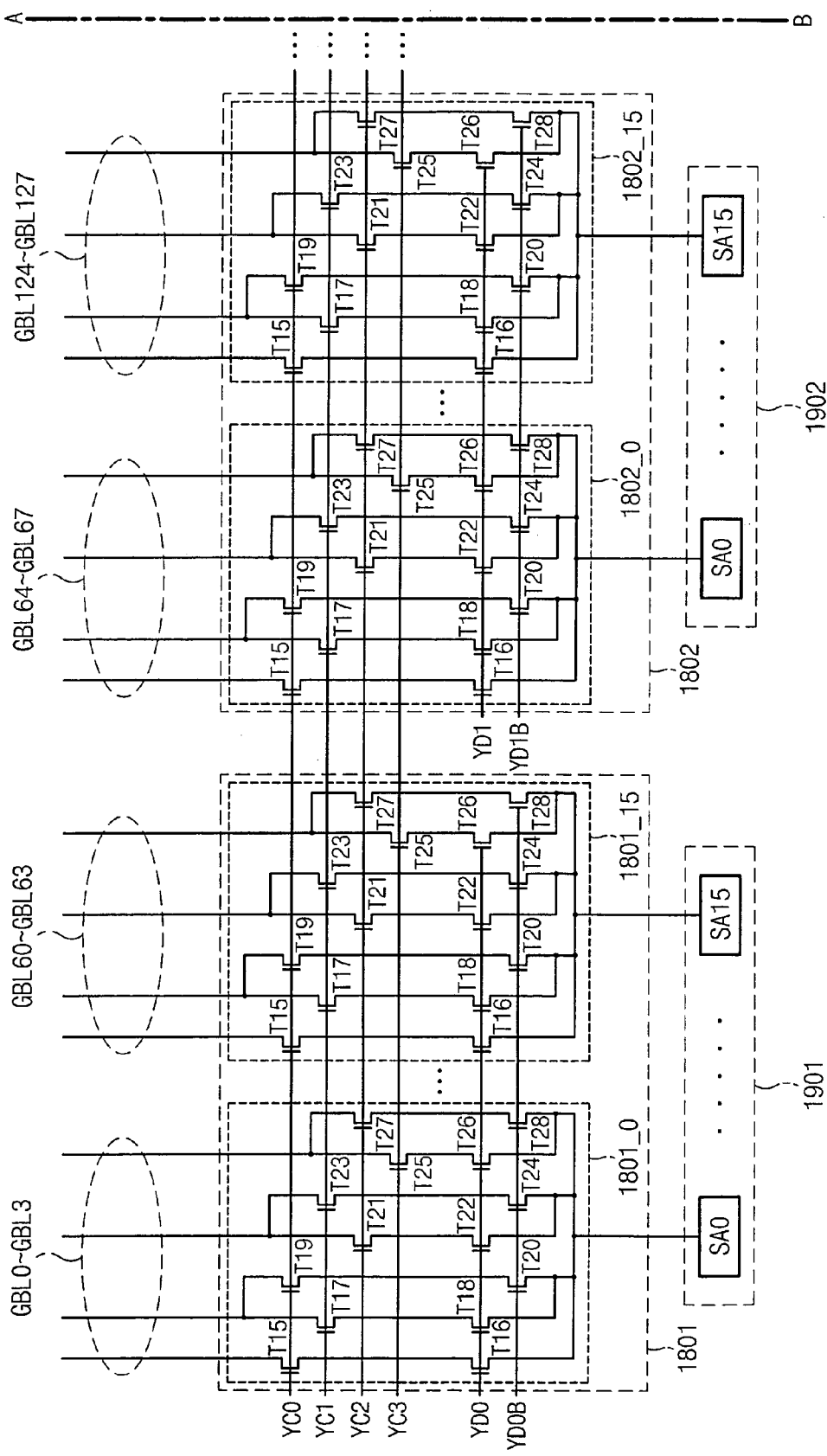
FIG. 10 is a circuit diagram of an example second column gate block of FIG. 7 according to embodiments of the invention.
Figure 10B:
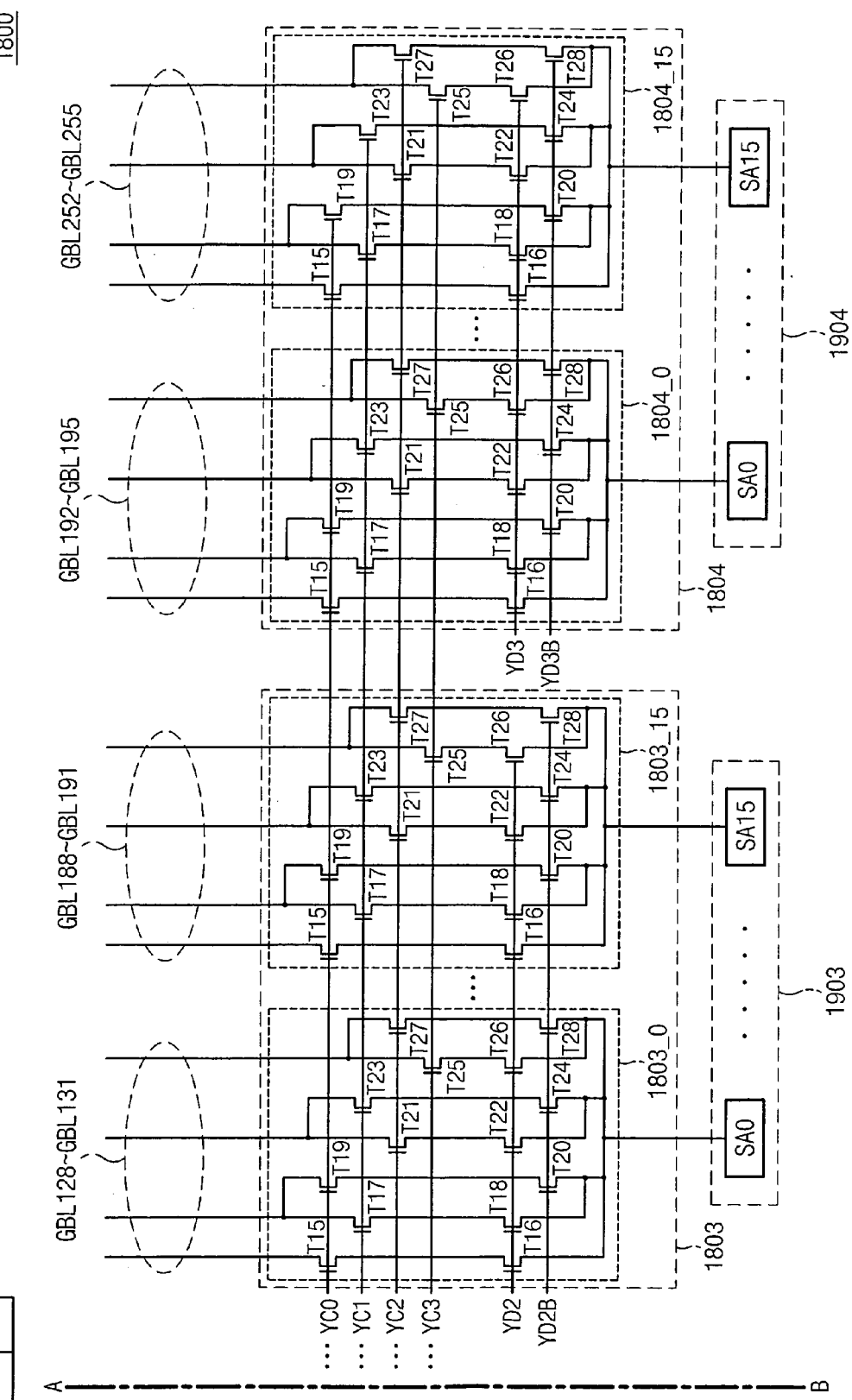

If a column address is 4N-aligned (that is, a data word of a first sense amplifier group 1901 in FIG. 10 is firstly output), the judgment circuit 1720 activates select signals YD0, YD1, YD2 and YD3 and deactivates select signals YD0B, YD1B, YD2B and YD3B. When a column address is not 4N-aligned and a data word of a second sense amplifier group 1902 is firstly output, the judgment circuit 1720 activates select signals YD0B and YD1–YD3 and deactivates select signals YD0 and YD1B–YD3B. When a column address is not 4N-aligned and a data word of a third sense amplifier group 1903 is firstly output, the judgment circuit 1720 activates select signals YD0B, YD1B, YD2 and YD3 and deactivates select signals YD0, YD1, YD2B and YD3B. When a column address is not 4N-aligned and a data word of a fourth sense amplifier group 1904 is firstly output, the judgment circuit 1720 activates select signals YD0B, YD1B, YD2B and YD3 and deactivates select signals YD0, YD1, YD2 and YD3B.

The decoder 1710 and the judgment circuit 1720 in FIG. 9 are configured the same as those in FIGS. 4 and 5, and description thereof is thus omitted.

FIG. 10 is a circuit diagram showing an example embodiment of a second column gate block of FIG. 7. In this embodiment, when a burst length is 4 and a bit organization is X16, four sense amplifier groups 1901, 1902, 1903 and 1904 are needed and each of the sense amplifier groups 1901–1904 consists of 16 sense amplifiers SA0–SA15.

The present column block 1800 includes column gate circuits 1801, 1802, 1803 and 1804 corresponding to sense amplifier groups 1901–1904, respectively. Each of the column gate circuits 1801–1804 includes a plurality of column gate units connected respectively to sense amplifiers of a corresponding sense amplifier group. For example, a column gate circuit 1801 includes 16 column gate units 1801_0–1801_15. Each of the column gate units 1801_0–1801_15 selects 16 global bit lines of 64 global bit lines in response to select signals, and connects the selected global bit lines to sense amplifiers of a corresponding sense amplifier group, respectively.

For example, the column gate circuit 1801 selects 16 global bit lines of global bit lines GBL0–GBL63 in response to select signals YC0–YC3, YD0 and YD0B, and connects the selected global bit lines to corresponding sense amplifiers SA0–SA15 of a first sense amplifier group 1901. The column gate circuit 1802 selects 16 global bit lines of global bit lines GBL64–GBL127 in response to select signals YC0–YC3, YD1 and YD1B, and connects the selected global bit lines to corresponding sense amplifiers SA0–SA15 of a second sense amplifier group 1902. The column gate circuit 1803 selects 16 global bit lines of global bit lines GBL128–GBL191 in response to select signals YC0–YC3, YD2 and YD2B, and connects the selected global bit lines to corresponding sense amplifiers SA0–SA15 of a third sense amplifier group 1903. The column gate circuit 1804 selects 16 global bit lines of global bit lines GBL192–GBL255 in response to select signals YC0–YC3, YD3 and YD3B, and connects the selected global bit lines to corresponding sense amplifiers SA0–SA15 of a fourth sense amplifier group 1904.

Still referring to FIG. 10, a first column gate unit 1801_0 in the column gate circuit 1801 includes 14 NMOS transistors T15–T28. The NMOS transistors T15 and T16 are connected between a global bit line GBL0 and a sense amplifier SA0 and are controlled by select signals YC0 and YD0, respectively. The NMOS transistors T17 and T18 are cascaded between a global bit line GBL1 and the sense amplifier SA0 and are controlled by select signals YC1 and YD0, respectively. The NMOS transistors T19 and T20 are cascaded between the global bit line GBL1 and the sense amplifier SA0 and are controlled by select signals YC0 and YD0B, respectively. The NMOS transistors T21 and T22 are connected in series between a global bit line GBL2 and the sense amplifier SA0 and controlled by select signals YC2 and YD0, respectively. The NMOS transistors T23 and T24 are cascaded between the global bit line GBL2 and the sense amplifier SA0 and are controlled by select signals YC1 and YD0B, respectively. The NMOS transistors T25 and T26 are connected serially between a global bit line GBL3 and the sense amplifier SA0 and are controlled by select signals YC3 and YD0, respectively. The NMOS transistors T27 and T28 are cascaded between the global bit line GBL3 and the sense amplifier SA0 and are controlled by select signals YC2 and YD0B, respectively.

The other column gate units 1801_2–1801_15 are configured the same as the first column gate unit 1801_0, and description thereof is thus omitted. Similarly, column gate units of each of the other column gate circuits 1802–1804 are configured the same as the column gate unit 1801_0, and description thereof is thus omitted. In FIG. 10, constituent elements of each column gate unit are marked by the same symbols.

As understood from the figure, the select signals YC0–YC3 are commonly provided to NMOS transistors T15, T17, T19, T21, T23, T25 and T27 of column gate units of each of the column gate circuits 1801–1804.

In this embodiment, the NMOS transistors T15, T16, T17, T18, T21, T22, T24 and T26 constitute a way (or a switch circuit) for selecting one of global bit lines when a column address is 4N-aligned, the selected bit line corresponding to a presently input column address. The NMOS transistors T19, T20, T23, T24, T27 and T28 constitute a way (or a switch circuit) for selecting one of global bit lines when a column address is not 4N-aligned, the selected bit line corresponding to an upper column address of a presently input column address.

An operation of a flash memory device according to this embodiment of the invention will be described more fully below with reference to accompanying drawings.

As row and column addresses for a burst read operation are input, firstly, a row selector circuit (not shown) selects one (e.g., 1101) of sectors of a memory cell array 1100 according to the row address, and a word line of the selected sector is activated. At the same time, a first column decoder circuit 1200 generates select signals for controlling a first column gate block 1500 in response to a column address from a column pre-decoder circuit 1300. A second column decoder circuit 1400 generates select signals for controlling a sector selector circuit 1600 in response to a column address from the column pre-decoder circuit 1300. A third column decoder circuit 1700 generates select signals for controlling a second column gate block 1800 in response to a column address from the column pre-decoder circuit 1300.

A column gate circuit 1501 of the selected sector 1101 selects a part of local bit lines BL0–BLm in response to select signals YA0–YA3 from the first column decoder circuit 1200. The sector selector circuit 1601 of the selected sector 1101 connects the selected local bit lines to corresponding global bit lines GBL0–GBLn respectively in response to a select signal YB0. At the same time, as illustrated in FIG. 9, a decoder 1710 decodes a part An and An+1 of a column address to activate one of select signals YC0–YC3. For example, assume that a select signal YC0 is activated. As the select signal YC0 is activated, NMOS transistors T15 and T19 of each column gate circuit of a second column gate block 1800 are turned on. At the same time, a judgment circuit 1720 responds to lower address signals A0 and A1 of the received column address and judges whether the received column address is 4N-aligned. As described above, that the column address is 4N-aligned means that a data word of a first sense amplifier group is firstly issued. The judgment circuit 1720 outputs select signals YD0–YD3 and YD0B–YD3B according to a judgment result.

For example, when an input column address is 4N-aligned, the judgment circuit 1720 activates the select signals YD0, YD1, YD2 and YD3 high. NMOS transistors T16, T18, T22 and T26 of each column gate unit are turned on by activation of the select signals YD0, YD1, YD2 and YD3. Accordingly, each column gate unit selects a first one of corresponding global bit lines. That is, global bit lines GBL0, GBL4, . . . , GBL60 are connected to corresponding sense amplifiers SA0–SA15 through a column gate circuit 1801. The other column gate circuits select global bit lines by the same manner as described above. Selected global bit lines correspond to a presently received column address.

Afterward, sense amplifiers SA0–SA15 of each of sense amplifier groups 1901–1904 sense and amplify data by a well-known manner. If a sense amplification operation is completed, data words sensed by sense amplifier groups 1901–1904 are output to the outside of the memory device in this order. At this time, output data words are considered at the outside as data words of Nth, (N+1)th, (N+2)th and (N+3)th column addresses.

If the received column address is not 4N-aligned, the judgment circuit 1720 activates a part of the select signals YD0, YD1, YD2 and YD3. At this time, complementary signals of deactivated select signals are activated. For example, when column address signals A1A0 are "01", select signals YD0B, YD1, YD2 and YD3 are activated. As the select signals YD0B, YD1, YD2 and YD3 are activated, NMOS transistors T20, T24 and T28 of each column gate unit of a first column gate circuit 1801 are turned on while NMOS transistors T16, T18, T22 and T26 of each column gate unit of the other column gate circuits 1802–1804 are turned on. Accordingly, each column gate unit of second to fourth gate columns 1802–1804 selects a first one of corresponding global bit lines while each column gate unit of a first column gate circuit 1801 selects a second global bit line. That is, the second column gate circuit 1802 connects global bit lines GBL64, GBL68, . . . , GBL124 to corresponding sense amplifiers SA0–SA15 respectively, the third column gate circuit 1803 connects global bit lines GBL128, GBL132, . . . , GBL188 to corresponding sense amplifiers SA0–SA15 respectively, and the fourth column gate circuit 1804 connects global bit lines GBL192, GBL196, . . . , GBL252 to corresponding sense amplifiers SA0–SA15 respectively. On the other hand, the first column gate circuit 1801 connects global bit lines GBL1, GBL5, . . . , GBL61 to sense amplifiers SA0–SA15, respectively.

Herein, the second to fourth column gate circuits 1802–1804 select global bit lines of a presently received column address (e.g., N) while the first column gate circuit 1801 selects global bit lines of an upper address (e.g., N+1) of the presently received column address.

Afterward, sense amplifiers SA0–SA15 of each of sense amplifier groups 1901–1904 sense and amplify data by a well-known manner. If a sense amplification operation is completed, data words sensed by sense amplifier groups 1902, 1903, 1904 and 1901 are output to the outside of the memory circuit in this order. At this time, output data words are considered at the outside as data words of Nth, (N+1)th, (N+2)th and (N+3)th column addresses.

When a column address is not 4N-aligned, for example, when column address signals A1A0 are "10" and "11", a column selecting operation will be performed by the same manner as described above. For instance, when column address signals A1A0 are "10", data words sensed by sense amplifier groups 1903, 1904, 1901, and 1902 are output to the outside of the memory device in this order. Accordingly, the third and fourth column gate circuits select global bit lines of a presently input column address (e.g., N) while the first and second column gate circuits select global bit lines of an upper address (e.g., N+1) of the input column address. Output data words are considered at the outside as data words of Nth, (N+1)th, (N+2)th and (N+3)th column addresses. Similarly, when column address signals A1A0 are "11", data words sensed by sense amplifier groups 1904, 1901, 1902, and 1903 are output to the outside in this order. Accordingly, the fourth column gate circuit selects global bit lines of a presently input column address (e.g., N) while the first, second and third column gate circuits select global bit lines of an upper address (e.g., N+1) of the input column address. Output data words are considered at the outside as data words of Nth, (N+1)th, (N+2)th and (N+3)th column addresses.

In accordance with embodiments of the present invention, the number of column select signal lines can be prevented from being increased in proportion to increase in a burst length. The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A non-volatile semiconductor memory device comprising:
   a plurality of columns each of which is connected with a plurality of memory cells;
      a column selection circuit for selecting a part of the plurality of columns in response to a column address; and
      a plurality of sense amplifier groups connected to columns selected by the column selection circuit,
      wherein the column selection circuit is configured to select the columns determined by whether the column address is 4N-aligned (N being a positive integer of 1 or more).

2. The memory device according to claim 1, wherein the column selection circuit selects columns of the column address when the column address is 4N-aligned, and selects columns of an upper column address when the column address is not 4N-aligned.

3. The memory device according to claim 1, wherein the column selection circuit comprises:
   a gate circuit for selecting a part of the columns in response to first column selection signals and second column selection signals;
   a decoder for generating the first column selection signals in response to a first part of the column address; and
   a judging circuit configured to determine whether the column address is 4N-aligned, based on a second part of the column address, wherein the judging circuit is structured to generate the second column selection signals so that the gate circuit selects either columns of the column address or columns of an upper column address.

4. The memory device according to claim 3, wherein the second column address comprises at least two least significant bits of the column address.

5. The memory device according to claim 3, wherein the columns are divided into a plurality of column groups each corresponding to the plurality of sense amplifier groups and the gate circuit comprises a plurality of column gate units each corresponding to the plurality of column groups.

6. The memory device according to claim 5, wherein each of the plurality of column gate units comprises:
a selecting circuit configured to select a first one of columns of a corresponding column group in response to the first and second column selection signals when the column address is 4N-aligned; and
a second selecting circuit configured to select a second one of the columns of the corresponding column group in response to the first and second column selection signals when the column address is not 4N-aligned,
wherein the first bit line corresponds to the column address and the second bit line corresponds to an upper one of the column address.

7. The memory device according to claim 5, wherein each of the plurality of column groups comprises first, second, third, and fourth columns, the first column selection signals comprises four column selection signals, and the second column selection signals comprises two column selection signals.

8. The memory device according to claim 7, wherein each of the plurality of column gate units comprises:
first and second transistors connected in series between the first column and a sense amplifier of a corresponding sense amplifier group; third and fourth transistors connected in series between the second column and the sense amplifier; fifth and sixth transistors connected in series between the third column and the sense amplifier; seventh and eighth transistors connected in series between the fourth column and the sense amplifier; ninth and tenth transistors connected in series between the second column and the sense amplifier; eleventh and twelfth transistors connected in series between the third column and the sense amplifier; and thirteenth and fourteenth transistors connected in series between the fourth column and the sense amplifier.

9. The memory device according to claim 8, wherein the first and ninth transistors are controlled by a first one of the first column selection signals, the third and eleventh transistors are controlled by a second one thereof, the fifth and thirteenth transistors are controlled by a third one thereof, the seventh transistor is controlled by a fourth one thereof, the second, fourth, sixth and eighth transistors are controlled by one of the second column selection signals, and the tenth, twelfth and fourteenth transistors are controlled by the other one of the second column selection signals.

10. The memory device according to claim 9, wherein the one of the second column selection signals is activated when the column address is 4N-aligned.

11. The memory device according to claim 9, wherein the other one of the second column selection signals is activated when the column address is not 4N-aligned.

12. A non-volatile semiconductor memory device for performing a burst read operation of a predetermined burst length, comprising:
a plurality of sectors each of which includes a plurality of local bit lines;
a plurality of global bit lines;
a first column selection circuit for selecting one of the sectors and connecting a part of local bit lines of a selected sector to the plurality of global bit lines, respectively, based on a first part of a column address;
a plurality of sense amplifier groups each of which includes a plurality of sense amplifiers, the number of the sense amplifier groups corresponding to the burst length; and
a second column selection circuit for selecting the plurality of global bit lines variably based on whether a second one of the column address for selecting the plurality of sense amplifier groups is 4N-aligned,
wherein, when the column address is not 4N-aligned, the second column selection circuit connects a sense amplifier group of the second column address and an upper sense amplifier group(s) to global bit lines of the column address, and connects remaining lower sense amplifier groups to global bit lines of an upper column address.

13. The memory device according to claim 12, wherein, when the column address is 4N-aligned, the second column selection circuit connects the plurality of sense amplifier groups to global bit lines of the column address.

14. The memory device according to claim 12, wherein the second column address comprises at least two least significant bits of the column address.

15. The memory device according to claim 12, wherein the first column selection circuit comprises:
a first decoder for generating column selection signals in response to a part of the first column address;
a plurality of first column gate units each corresponding to the sectors and each selecting a part of local bit lines of a corresponding sector in response to the column selection signals;
a second decoder for generating sector selection signals in response to another part of the first column address; and
a plurality of sector selectors each corresponding to the sectors and each connecting the global bit lines to local bit lines selected by a corresponding first column gate unit, respectively.

16. The memory device according to claim 12, wherein the second column selection circuit comprises:
a column gate circuit for selecting a part of the global bit lines in response to first column selection signals and second column selection signals;
a decoder for generating the first column selection signals in response to a first part of the second column address; and
a judging circuit for determining whether the column address is 4N-aligned, based on a second part of the second column address, wherein the judging circuit generates the second column selection signals so that the second column gate circuit selects either global bit lines of the column address or global bit lines of an upper column address.

17. The memory device according to claim 16, wherein the global bit lines are divided into a plurality of groups each corresponding to the plurality of sense amplifier groups and the second column gate circuit comprises a plurality of column gate units corresponding to the plurality of groups of global bit lines.

18. The memory device according to claim 17, wherein each of the plurality of column gate units comprises:
a selecting circuit for selecting a first one of global bit lines of a corresponding group in response to the first and second column selection signals when the column address is 4N-aligned; and
a second selecting circuit for selecting a second one of the global bit lines of the corresponding group in response to the first and second column selection signals when the column address is not 4N-aligned.

19. The memory device according to claim 18, wherein each of the plurality of groups of global bit lines comprises first, second, third, and fourth global bit lines, the first column selection signals comprises four column selection signals, and the second column selection signals comprises two column selection signals.

20. The memory device according to claim 19, wherein the selecting circuit comprises:
   first and second transistors connected in series between the first global bit line and a sense amplifier of a corresponding sense amplifier group; third and fourth transistors connected in series between the second global bit line and the sense amplifier; fifth and sixth transistors connected in series between the third global bit line and the sense amplifier; and seventh and eighth transistors connected in series between the fourth global bit line and the sense amplifier,
   the first, third, fifth and seventh transistors being controlled by the first column selection signals respectively; and the second, fourth, sixth and eighth transistors being controlled by one of the second column selection signals.

21. The memory device according to claim 20, wherein the one of the second column selection signals is activated when the column address is 4N-aligned.

22. The memory device according to claim 20, wherein the second selecting circuit comprises:
   ninth and tenth transistors connected in series between the second global bit line and the sense amplifier; eleventh and twelfth transistors connected in series between the third global bit line and the sense amplifier; and thirteenth and fourteenth transistors connected in series between the fourth global bit line and the sense amplifier,
   the ninth, eleventh and thirteenth transistors being controlled by first, second, and third ones of the first column selection signals, respectively; and the tenth, twelfth and fourteenth transistors being controlled by the other of the column selection signals.

23. The memory device according to claim 22, wherein the other of the second column selection signals is activated when the column address is not 4N-aligned.

24. A NOR-type flash memory device comprising:
   a plurality of bit lines each of which is connected with a plurality of non-volatile memory cells;
   a column gate circuit for selecting at least one of the bit lines in response to first selection signals and second selection signals;
   at least one sense amplifier connected to a bit line selected by the column gate circuit;
   a decoder circuit for generating the first selection signals in response to a first part of a column address; and
   means for judging whether the column address is 4N-aligned, based on a second part of the column address, and generating the second selection signals,
   wherein the column gate circuit comprises a first switch circuit for selecting a first one of the bit lines in response to the first and second selection signals when the column address is 4N-aligned; and a second switch circuit for selecting a second one of the bit lines in response to the first and second selection signals when the column address is not 4N-aligned.

25. The memory device according to claim 24, wherein the bit lines comprises first, second, third, and fourth bit lines, the first selection signals comprises four column selection signals, and the second selection signals comprises two column selection signals.

26. The memory device according to claim 25, wherein the first switch circuit comprises:
   first and second transistors connected in series between the first bit line and the sense amplifier; third and fourth transistors connected in series between the second bit line and the sense amplifier; fifth and sixth transistors connected in series between the third bit line and the sense amplifier; and seventh and eighth transistors connected in series between the fourth bit line and the sense amplifier,
   the first, third, fifth and seventh transistors being controlled by the first selection signals respectively; and the second, fourth, sixth and eighth transistors being controlled by one of the second selection signals.

27. The memory device according to claim 26, wherein the one of the second column selection signals is activated when the column address is 4N-aligned.

28. The memory device according to claim 26, wherein the second switch circuit comprises:
   ninth and tenth transistors connected in series between the second bit line and the sense amplifier; eleventh and twelfth transistors connected in series between the third bit line and the sense amplifier; and thirteenth and fourteenth transistors connected in series between the fourth bit line and the sense amplifier,
   the ninth, eleventh and thirteenth transistors being controlled by first, second and third ones of the first selection signals respectively; and the tenth, twelfth and fourteenth transistors being controlled by the other of the second selection signals.

29. The memory device according to claim 28, wherein the other of the second column selection signals is activated when the column address is not 4N-aligned.

30. The memory device according to claim 24, wherein a bit line selected by the first switch circuit corresponds to the column address and a bit line selected by the second switch circuit corresponds to an upper one of the column address.

* * * * *

UNITED STATES PATENT AND TRADEMARK OFFICE
CERTIFICATE OF CORRECTION

PATENT NO.         : 7,042,795 B2                                        Page 1 of 1
APPLICATION NO.    : 10/816979
DATED              : May 9, 2006
INVENTOR(S)        : Seung-Keun Lee et al.

It is certified that error appears in the above-identified patent and that said Letters Patent is hereby corrected as shown below:

Column 6, line 3, the word "N-1" should read -- N+1 --.

Signed and Sealed this

Eighteenth Day of August, 2009

David J. Kappos
*Director of the United States Patent and Trademark Office*